(12) United States Patent
Goundar et al.

(10) Patent No.: US 7,091,133 B2
(45) Date of Patent: Aug. 15, 2006

(54) TWO-STEP FORMATION OF ETCH STOP LAYER

(75) Inventors: Kamal Kishore Goundar, Tama (JP); Tadashi Kumakura, Tama (JP)

(73) Assignee: ASM Japan K.K., Tokyo (JP)

( * ) Notice: Subject to any disclaimer, the term of this patent is extended or adjusted under 35 U.S.C. 154(b) by 555 days.

(21) Appl. No.: 10/352,357

(22) Filed: Jan. 27, 2003

(65) Prior Publication Data

US 2004/0147115 A1 Jul. 29, 2004

(51) Int. Cl.
*H01L 21/31* (2006.01)

(52) U.S. Cl. .................................. 438/758; 438/768
(58) Field of Classification Search ................ 438/758, 438/706; 257/758

See application file for complete search history.

(56) References Cited

U.S. PATENT DOCUMENTS

| | | | | |
|---|---|---|---|---|
| 5,900,064 A | * | 5/1999 | Kholodenko | 118/723 R |
| 6,004,885 A | * | 12/1999 | Hayakawa et al. | 438/758 |
| 6,376,353 B1 | * | 4/2002 | Zhou et al. | 438/612 |
| 6,500,357 B1 | * | 12/2002 | Luo et al. | 216/79 |
| 6,566,242 B1 | * | 5/2003 | Adams et al. | 438/622 |
| 6,645,851 B1 | * | 11/2003 | Ho et al. | 438/626 |
| 6,680,540 B1 | * | 1/2004 | Nakano et al. | 257/758 |
| 2004/0043626 A1 | * | 3/2004 | Chou San et al. | 438/758 |

* cited by examiner

*Primary Examiner*—Michael Lebentritt
(74) *Attorney, Agent, or Firm*—Knobbe, Martens Olson & Bear LLP

(57) ABSTRACT

A film is formed on a semiconductor substrate where a copper layer is to be formed and in contact with the film, by a method including the steps of: (i) introducing a first reaction gas comprising a deposition gas containing silicon, carbon, and hydrogen, and an inert gas, into a reaction space where a substrate is placed; (ii) depositing a silicon carbide film on the substrate by exciting the first reaction gas into a plasma; (iii) introducing a second reaction gas comprising a deposition gas containing silicon, carbon, and hydrogen, an oxidizing gas, and an inert gas, into the reaction space; and (iv) depositing a carbon-containing silicon oxide film on top of the silicon carbide film by exciting the second reaction gas into a plasma.

28 Claims, 15 Drawing Sheets

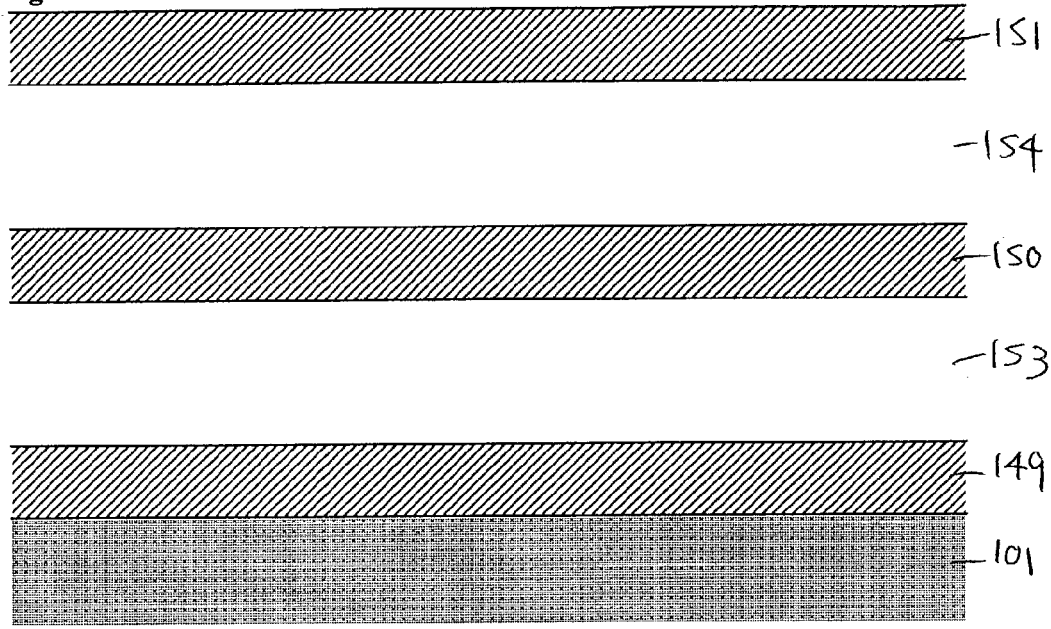
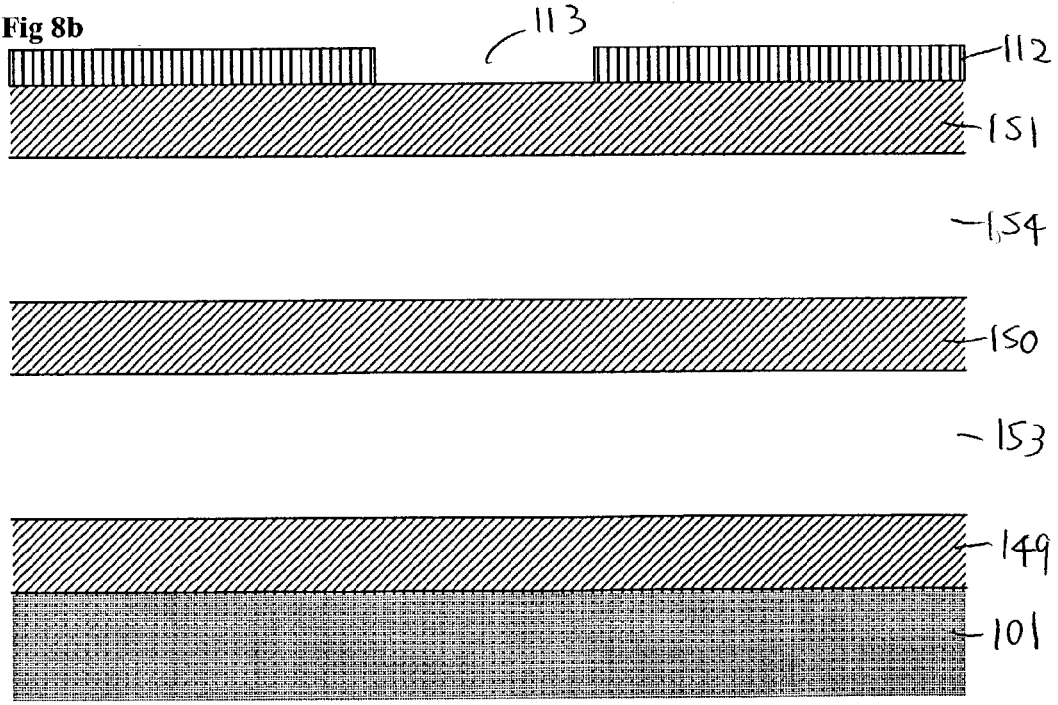

TWO-STEP FORMATION OF ETCH STOP LAYER

BACKGROUND OF THE INVENTION

1. Field of the Invention

This invention relates to a method for forming a silicon carbide film using a plasma CVD apparatus, and particularly to a method for forming, as an etch stop layer, a silicon carbide film and a silicon oxide film.

2. Description of the Related Art

Conventionally, in LSI devices, e.g., CPU's, memories and system LSI's, aluminum alloy has been used for metal wiring. To insulate between the metal wiring, silicon oxide films are used. In some LSI devices, fluorine-containing silicon oxide films may be used.

In recent years, to strive for speeding up LSI devices, copper having smaller electric resistance has been adopted for metal wiring. To reduce wiring capacity causing delays in electronic signals, carbon-containing silicon oxide films having a low dielectric constant have begun to be adopted.

In the LSI device having copper wiring structure, an etch stop film is used for an insulation film for the carbon-containing silicon oxide film for making grooves or holes for installing copper wiring. Because the etch stop film has a slower dry etching rate as compared with the carbon-containing silicon oxide film, a silicon nitride film, which has a function for preventing copper diffusion, has been used. In the case of the silicon nitride film, however, due to its dielectric constant of approximately 7, even if a carbon-containing silicon oxide film is used, wiring capacity in its entirety increases attributable to a high dielectric constant of the etch stop film.

Consequently, using the silicon carbide film as an etch stop film was developed as presented in U.S. Pat. No. 5,800,878. A dielectric constant of the silicon carbide film is approximately 5. The silicon carbide films are applied to LSI devices using copper wiring in combination with carbon-containing silicon oxide films, whose dielectric constant is approximately 3.

There are several different types of composition for what is generally called silicon carbide films.

One type is a silicon carbide film comprising Si, C and H. This film has a characteristic of easily absorbing oxygen and moisture. Its stress and dielectric constant change if it is left in the atmosphere. Additionally, its current leakage is high and its insulating capability is poor. A dielectric constant of the silicon carbide film is approximately from 5 to 4.5.

Silicon carbide films comprising Si, C, N and H or Si, C, O and H are disclosed in P2001-30369A1, P2002-27286A1, P2001-51445A1 and P2001-31563A1 (Published U.S. patent applications). It can be said that the silicon carbide films have low current leakage and excellent insulating capability as compared with the above-mentioned SiCH film. Particularly, an SiCOH film can achieve a dielectric constant of nearly 4 (approximately 4.2) depending on a ratio of oxygen contained.

When the carbon-containing silicon oxide film is deposited directly above Cu wiring, however, there are problems described below. FIG. 6 is a cross section of device structure using Cu wiring and a low-k film, and etch stop layers. When the film is formed in etch stop layers 50, 51 and 52, and if a carbon-containing silicon oxide film is deposited directly at points 57, 58 and 59 at which the Cu wiring and the etch stop layers contact, Cu and oxygen react, and film peeling occurs.

SUMMARY OF THE INVENTION

In view of the above problems, in an embodiment of the present invention, a method is provided to form a silicon carbide film having a low dielectric constant and good adhesion to a surface of copper wiring. In another embodiment of the present invention, a method is provided to form an etch stop layer in a damascene structure. The present invention can be applied to any interconnection structures using low-dielectric layers such as silicon oxide films. Because the silicon carbide film of the present invention has a low dielectric constant and good adhesion to a surface of copper wiring, the present invention can effectively be applied to various damascene methods.

The present invention has been achieved based on an approach of forming an etch stop film which does not cause detaching or peeling from a surface of copper wiring by forming a silicon carbide film containing no oxygen at a thickness as thin as possible directly on Cu, and then forming a low-k (low-dielectric constant) carbon-containing silicon oxide film. In an embodiment, the present invention provides an etch stop film used for LSI devices using copper wiring, which film is a silicon carbide film characterized in that: 1) its dielectric constant is low, 2) it has a low current leakage value (high insulation capacity), 3) it can be formed directly on Cu, and 4) it can be a hard mask which does not oxidize a Cu surface.

The present invention includes, but are not limited to, the following embodiments:

1) A method for forming a film on a semiconductor substrate where a copper layer is to be formed and in contact with the film, comprising the steps of: (I) introducing a first reaction gas comprising a deposition gas containing silicon, carbon, and hydrogen, and an inert gas, into a reaction space where a substrate is placed; (II) depositing a silicon carbide film on the substrate by exciting the first reaction gas into a plasma; (III) introducing a second reaction gas comprising a deposition gas containing silicon, carbon, and hydrogen, an oxidizing gas, and an inert gas, into the reaction space; and (IV) depositing a carbon-containing silicon oxide film on top of the silicon carbide film by exciting the second reaction gas into a plasma.

2) The method according to Item 1, wherein the silicon carbide film contains no oxygen.

3) The method according to any one of Items 1–2, wherein the silicon carbide film is formed where a copper wiring layer is to be formed and in contact with the silicon carbide film.

4) The method according to any one of Items 1–3, wherein the excitation of the first and second reaction gases are conducted by applying radio-frequency (RF) power to the respective gases.

5) The method according to Item 4, wherein the step for depositing the silicon carbide and the step for depositing the carbon-containing silicon oxide film are continuously performed without interruption of RF power supply.

6) The method according to Item 4, wherein RF power supply is discontinued between the step for depositing the silicon carbide and the step for depositing the carbon-containing silicon oxide film.

7) The method according to Item 6, wherein RF power supply is reinitiated after introducing the second reaction gas and stabilizing the pressure.

8) The method according to any one of Items 1–7, wherein the deposition gas is tetramethylsilane or trimethylsilane.

9) The method according to any one of Items 1–8, wherein the inert gas is argon, helium, neon, xenon, or krypton.

10) The method according to any one of Items 1–9, wherein the silicon carbide film comprises silicon, carbon, nitrogen and hydrogen.

11) The method according to any one of Items 1–10, where the carbon-containing silicon oxide film comprises silicon, carbon, oxygen and hydrogen.

12) The method according to any one of Items 1–11, wherein the carbon-containing silicon oxide film is formed at a temperature of the substrate of 300° C. to 400° C. (in other embodiments, a range of 250° C. to 500° C., a range of 350° C. to 450° C., and a range including any combination of the foregoing).

13) The method according to any one of Items 1–12, where the silicon carbide film is formed at a temperature of the substrate of 300° C. to 400° C. (in other embodiments, a range of 250° C. to 500° C., a range of 350° C. to 450° C., and a range including any combination of the foregoing).

14) The method according to any one of Items 1–13, wherein the deposition of the silicon carbide film is discontinued when the thickness of the silicon carbide film reaches 3 nm to 10 nm (in other embodiments, a range of 1 nm to 50 nm, a range of 5 nm to 20 nm, a range of 10 nm to 30 nm, and a range including any combination of the foregoing).

15) The method according to any one of Items 1–14, wherein the deposition of the carbon-containing silicon oxide film is discontinued when the thickness of the carbon-containing silicon oxide film reaches 30 nm to 70 nm (in other embodiments, a range of 10 nm to 200 nm, a range of 20 nm to 100 nm, a range of 40 nm to 60 nm, and a range including any combination of the foregoing).

16) The method according to any one of Items 1–15, wherein the step for depositing the silicon carbide film and the step for depositing the carbon-containing silicon oxide film are conducted in a reaction chamber where a low dielectric layer is formed on the substrate.

17) The method according to any one of Items 1–16, wherein the step for depositing the silicon carbide film and the step for depositing the carbon-containing silicon oxide film are conducted in a reaction chamber in the vicinity of a reaction chamber where a low dielectric layer is formed on the substrate.

18) The method according to any one of Items 1–17, wherein the film is an etch stop layer.

19) The method according to any one of Items 1–18, wherein the film is a hard mask.

20) A method for manufacturing on a semiconductor substrate an interlayer structure containing a film in contact with a copper layer, comprising the steps of: (i) forming multiple layers on a semiconductor substrate; (ii) forming a hole for an interlayer connection of the multiple layers by etching; (iii) depositing copper in the hole; (iv) removing an excess of the copper from a top of the multiple layers; (v) depositing a silicon carbide film on the top of the multiple layers by plasma reaction, wherein the copper is covered by the silicon carbide film; and (vi) depositing a carbon-containing silicon oxide film on top of the silicon carbide film by plasma reaction, wherein the top of the multiple layer in step (iv) can be any suitable resulting surface after removing the copper; e.g., the top surface can be a surface of a low-k layer which is exposed after removing the copper and an underneath etch stop layer (and a resist).

21) The method according to Item 20, wherein the multiple layers comprise a lower etch stop layer, a low dielectric layer, and an upper etch stop layer laminated in sequence on the substrate, and in step (ii) the hole is produced by forming a resist on top of the upper etch stop layer and forming a via hole by etching the multiple layers using the resist, and in step (iv) the resist and the upper etch stop layer are removed when removing the excess of the copper.

22) The method according to Item 20, wherein the multiple layers comprise a lower etch stop layer, a lower low dielectric layer, an intermediate etch stop layer, an upper low dielectric layer, and in step (ii) an upper etch stop layer laminated in sequence on the substrate, and the hole is produced by forming a resist on top of the upper etch stop layer and forming a via hole and trench by etching the multiple layers using the resist, and in step (iv) the resist and the upper etch stop layer are removed when removing the excess of the copper.

23) The method according to any one of Items 20–22, wherein prior to step (i), a low dielectric layer is formed on the substrate, and the multiple layers are formed on top of the low dielectric layer.

24) The method according to any one of Items 20–23, wherein steps (i) through (iv) are repeated at least once.

The present invention can be applied to various damascene methods which include, but are not limited to, the damascene methods disclosed in the following, the disclosure of which is incorporated herein by reference in its entirety:

(1) U.S. Pat. No. 6,100,184 to Zhao et al., teaching a dual damascene method for forming a copper-containing contiguous patterned conductor interconnect and a patterned conductor stud layer within a corresponding trench contiguous with a corresponding via formed through a dielectric layer formed with a comparatively low dielectric constant dielectric material, thereby contacting a copper-containing conductor layer formed thereunder, wherein a conductor barrier/etch-stop layer is used to selectively passivate only the top surface of the copper-containing conductor layer formed thereunder;

(2) U.S. Pat. No. 6,140,226 to Zhao et al. teaching a dual damascene method for forming a contiguous patterned conductor interconnect and a patterned conductor stud layer within a corresponding trench contiguous with a corresponding via through a dielectric layer formed with a comparatively low dielectric constant dielectric material wherein a sidewall liner layer is used for the purposes of protecting a sidewall of the trench from lateral etching when contiguously forming the via therewith;

(3) U.S. Pat. No. 6,177,364 to Huang teaching a dual damascene method for forming a contiguous patterned conductor interconnect and a patterned conductor stud layer within a corresponding trench contiguous with a corresponding via through a dielectric layer formed with a comparatively low dielectric constant fluorosilicate glass (FSG) dielectric material wherein a hydrogen-nitrogen plasma treatment is employed for the purposes of passivating a sidewall surface of the dielectric layer within the corresponding trench contiguous with the corresponding via prior to forming therein the contiguous patterned conductor interconnect and patterned conductor stud layer; and (4) U.S. Pat. No. 6,211,092 to Tang et al. teaching a counterbore type dielectric etch method which may be employed when forming through a dielectric layer a dual damascene aperture for a dual damascene method, wherein the counterbore type dielectric etch method uses a plurality of etch steps when first forming a via through the dielectric layer.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

FIGS. 8a to 8j are schematic diagrams showing formation of an interlayer connection structure according to an embodiment of a dual damascene method.

DETAILED DESCRIPTION OF THE PREFERRED EMBODIMENT

Figure 1:
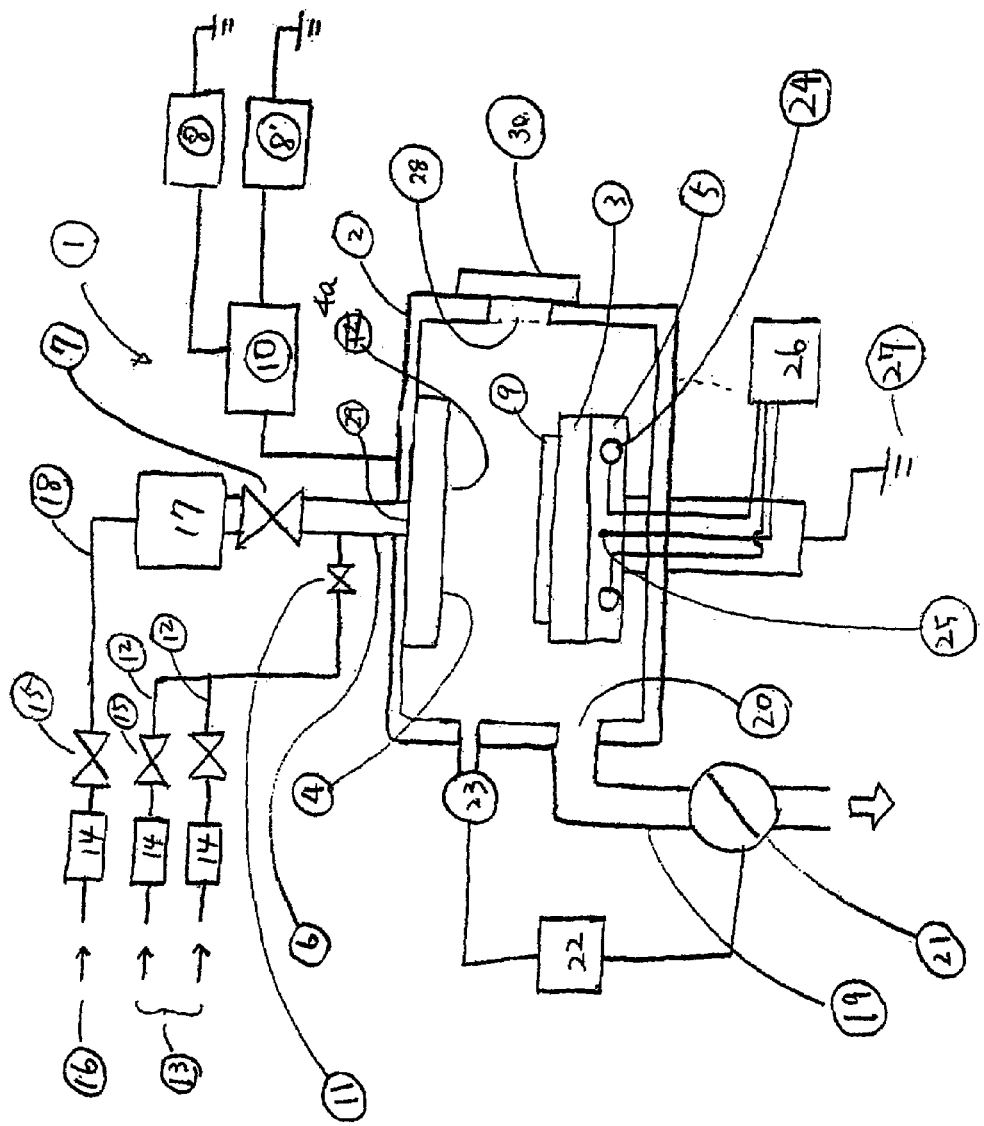
FIG. 1 is a schematic diagram illustrating a plasma CVD apparatus used for forming an insulation film of this invention.

In the present invention, a film is formed on a semiconductor substrate where a copper layer is to be formed and in contact with the film, by a method comprising the steps of: (I) introducing a first reaction gas comprising a deposition gas containing silicon, carbon, and hydrogen, and an inert gas, into a reaction space where a substrate is placed; (II) depositing a silicon carbide film on the substrate by exciting the first reaction gas into a plasma; (III) introducing a second reaction gas comprising a deposition gas containing silicon, carbon and hydrogen, an oxidizing gas, and an inert gas, into the reaction space; and (IV) depositing a carbon-containing silicon oxide film on top of the silicon carbide film by exciting the second reaction gas into a plasma.

In an preferred embodiment, to form a silicon carbide film and a carbon-containing silicon oxide film, tetramethylsilane, (Si(CH$_3$)$_4$) (referred to as "TMS" hereinafter) and oxygen are used as silicon, oxygen carbon sources and are brought into the reaction chamber after mixing them with an inert gas. A gas-emitting plate, which is set up opposing to a semiconductor substrate heated within the limits of 300° C. to 400° C., for example, on a substrate-supporting component having a heating unit, has 1000 to 5000 gas-emitting holes, for example, with an inside diameter of 0.5 mm to 1.0 mm (in other embodiments, a range of 0.1 mm to 2.0 mm, or a range including any combination of the foregoing) so that TMS mixed with the inert gas and oxygen (the mixed gas is called "deposition gas" or "reaction gas") is equally supplied onto the semiconductor substrate. The deposition gas supplied from the gas-emitting plate into the space above the semiconductor substrate is excited by plasma discharge formed by radio-frequency power applied to the gas-emitting plate and is decomposed, enabling growing of a silicon carbide film and a carbon-containing silicon oxide film on the semiconductor substrate.

In an embodiment, the sequence of growing the silicon carbide film and the carbon-containing silicon oxide film is executed in two stages: The first step in which the silicon carbide film not containing oxygen is formed on the semiconductor substrate, and the second step in which the carbon-containing silicon oxide film is formed by adding an oxidizing gas. An SiCH film or a SiCNH film is formed as the silicon carbide film not containing oxygen. The SiCH or the SiCNH film is adequately thin as compared with the carbon-containing silicon oxide film, which is formed thereon. In another embodiment, the first step and the second step can be repeated more than once, or these steps can be conducted so that the film has a graded structure. That is, the first step and the second step can be gradually shifted. For example, the first layer (i.e., silicon carbide layer) may have a thickness of 3 nm to 10 nm, and the second layer (i.e., carbon-containing silicon oxide layer) may have a thickness of 30 nm to 70 nm. In an embodiment, there is an intermediate layer which is a graded layer which can be formed by gradually increasing the flow of an oxidizing gas. The intermediate layer may have a thickness of 3 mm to 30 mm (in an embodiment, 5 nm to 15 mm). In another embodiment, there may not be a discrete first layer, but the intermediate layer begins from zero oxygen to a predetermined level. For example, the carbon-containing silicon oxide can be expressed as $Si_wO_xC_yH_z$ wherein w+x+y+z=1, x=0.2–0.6 (or 0.3–0.4), y=0.05–0.3 (or 0.1–0.2), w=0.2–0.6 (or 0.3–0.5), z=0.1–0.3. In contrast, the silicon carbide may be expressed as $Si_mC_nN_pH_q$ wherein m+n+p+q=1, m=0.2–0.6 (or 0.3–0.4), n=0.1–0.3 (or 0.1–0.2), p=0.0–0.6 (or 0.2–0.5), q=0.1–0.3.

As radio-frequency power applied to the gas-emitting plate, radio-frequency power synthesized from radio-frequency power (13 MHz or higher) and radio-frequency power (100 kHz to 1 MHz) is used. When these two frequencies are used, the relatively lower radio-frequency power can be applied to the substrate-supporting component supporting the semiconductor substrate. As the relatively higher radio-frequency power, 13.56 MHz or 27.12 MHz radio-frequency power, which is industrially used, can be used. Use of 27.12 MHz exhibits effects such as a reduction in plasma damage to a semiconductor substrate to be processed and a reduction in an electrical charge caused by a plasma.

A deposition gas comprising TMS and an inert gas mixed at a preset ratio is supplied to a plasma discharging area to be formed between the substrate-supporting component supporting a semiconductor substrate and the gas-emitting plate. After a stabilized flow of deposition gas and stabilization of a pressure inside the reaction chamber are confirmed, radio-frequency power synthesized from 27.12 MHz and 400 kHz is applied to the gas-emitting plate and the plasma discharging area is formed. With the plasma discharging area formed by a fixed flow of the deposition gas, a silicon carbide film and a carbon-containing silicon oxide film are formed on the semiconductor substrate.

FIG. 1 shows a schematic cross section of a preferred mode for carrying out the plasma CVD apparatus having a substrate-supporting device according to an embodiment of the present invention. The plasma CVD apparatus 1 for forming a thin film on a semiconductor substrate comprises a reaction chamber 2, a susceptor 3 for placing a semiconductor substrate 9 thereon, which is set up inside the reaction chamber, a shower head 4 for emitting reaction gases equally to the semiconductor substrate, which is set up opposing to the susceptor 3, and an exhaust port 20 for evacuating air inside the reaction chamber.

An opening 19 is provided on a side surface of the reaction chamber 2. The reaction chamber 2 is connected to a transfer chamber (not shown) for carrying and out the semiconductor substrate 9 via a gate valve 30.

The susceptor 3 for placing the semiconductor substrate 9 on it, which is set up inside the reaction chamber 2, possesses an aluminum alloy heater 5 beneath it, and is capable of heating the semiconductor substrate up to a given temperature. Inside the aluminum alloy heater 5, a resistance-heating type sheath heater 24 and a thermocouple 25 are provided, which are respectively connected to an external temperature controller 25, enabling a temperature of the aluminum alloy heater 5 to be kept at a given temperature. The susceptor 3 for placing the semiconductor substrate 9 on it and the aluminum alloy heater 5 are grounded 27 for forming one electrode for plasma discharge. In place of the susceptor 3 and the aluminum alloy heater 5, a ceramic heater can be used. In this case, the ceramic heater is also used as a susceptor directly holding a semiconductor substrate inside the reaction chamber. The ceramic heater comprises a ceramic base manufactured by integrally sintering a resistance-heating type heater with it. As a material for a ceramic base, a ceramic such as a nitride or an oxide enduring fluorine and chlorine active species can be mentioned. The ceramic base comprises preferably aluminum nitride. Aluminum oxide or magnesium oxide can be used as well.

The shower head 4 is set up opposing to the susceptor 3 inside the reaction chamber 2. At the bottom 4a of the shower head, thousands of fine pores (not shown) for emitting a jet of reaction gases to the substrate 9 are provided. The shower head 4 is electrically connected with radio-frequency oscillators (8, 8') preferably via a matching circuit. When a radio-frequency power source is connected with the susceptor, the shower head can be grounded. The shower head 4 forms the other electrode for plasma discharge. Radio-frequency oscillators (8, 8') generate radio-frequency power of two different frequencies, 13.56 to 27.12 MHz and 300 to 450 kHz respectively. The radio-frequency power of two different frequencies is synthesized inside the matching circuit 10 and is supplied to the shower head 4. A gas inlet pipe 6 for bringing reaction gases is connected to the shower head 4. Gas inlet piping 12 for deposition use is connected to the gas inlet pipe 6 via a valve 11. A gas inlet port 13 for pouring the gases is formed at one end of the gas inlet piping 12. On the way to the end, a mass flow controller 14 and a valve 15 are provided.

Connected to the gas inlet pipe 6, a remote plasma chamber 17 is provided via a valve 7, which is used for activating cleaning gas for cleaning the inside of the reaction chamber 2. For the remote plasma chamber 17, piping 18 for supplying cleaning gas is provided, and upstream of the piping, a valve 15 and a mass flow controller 14 are set up. Cleaning gas is supplied from a gas flow port 16 and is controlled at a given flow by the mass flow controller 14. According to a gas type, the number of gas ports 16 is determined.

Inside the reaction chamber 2, an exhaust port 20 is provided. The exhaust port 20 is connected to a vacuum exhaust pump (not shown) through piping 19. In the middle between the exhaust port 20 and the vacuum pump, a conductance adjustment valve 21 for regulating a pressure inside the reaction chamber 2 is provided. The conductance adjustment valve 21 is electrically connected to an external control unit 22. Preferably, a pressure gauge 23 for measuring a pressure inside the reaction chamber 2 is provided. The pressure gauge 23 is electrically connected with the control unit 22.

Working examples of forming a silicon carbide film and a carbon-containing silicon oxide film according to the present invention on a semiconductor substrate of diameter 200 m is described below.

Figure 2:
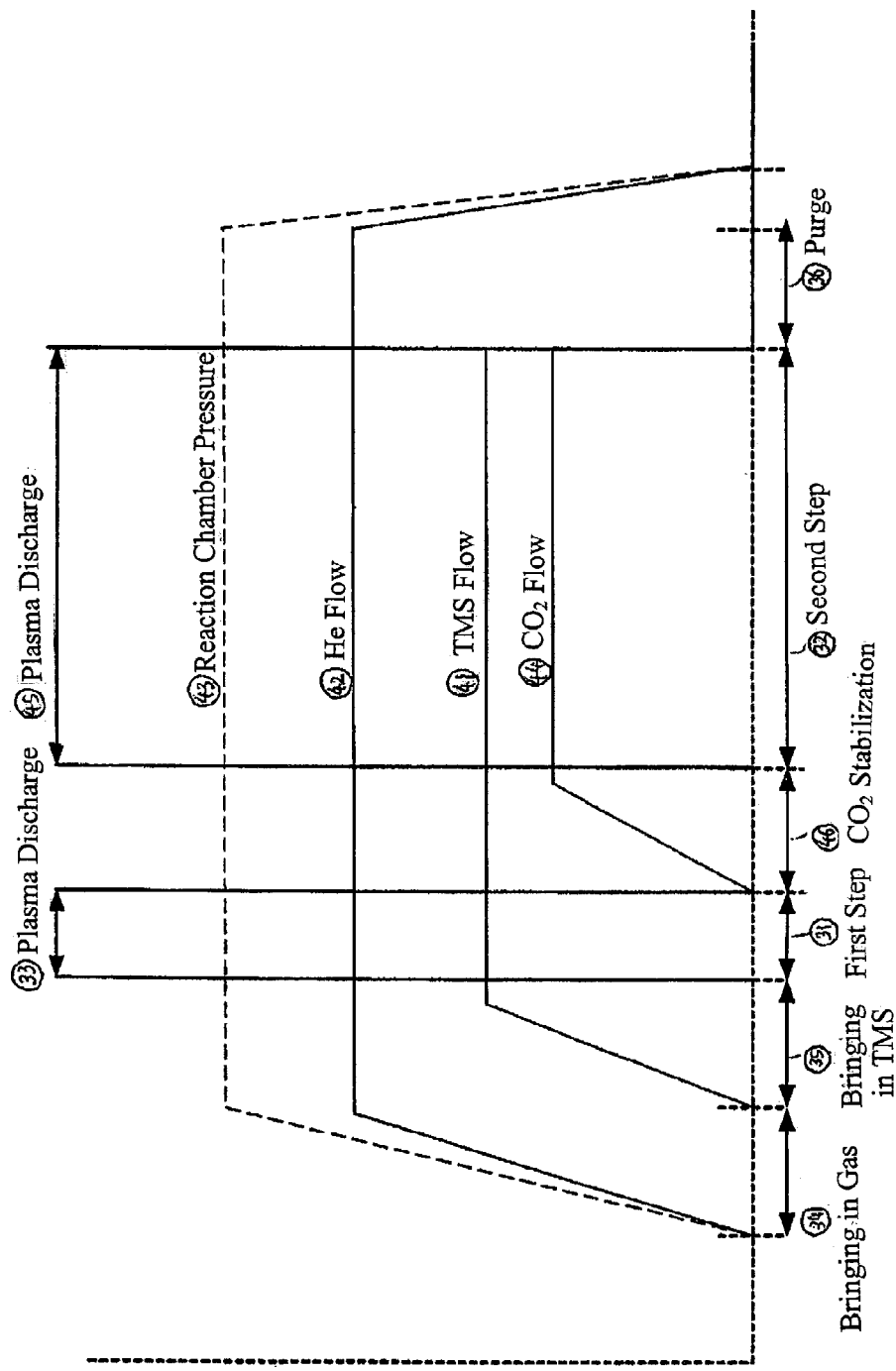
FIG. 2 is a timing chart showing operation sequences for depositing a silicon carbide film and a carbon-containing silicon oxide film on a substrate by plasma reaction according to an embodiment of the present invention.

FIG. 2 is a working example of the present invention. After a semiconductor substrate is carried into a reaction chamber and is heated at a given temperature, in Step 34 'Bringing in a gas', helium 42, which is an inert gas, is brought into the reaction chamber at a determined flow within the limits of 100 sccm to 3000 sccm, controlling 'a pressure inside the reaction chamber' 43 at a determined value within the limits of 1000 Pa to 1000 Pa. In Step 35 'Bringing in TMS', TMS 41 is brought into the reaction chamber at a determined flow within the limits of 100 sccm to 1000 sccm. For bringing in He and TMS gas, a ramp-up method in which a flow of respective gases is increased from zero to a given value at a specific rate during respective predetermined time frames is adopted. This method is used to prevent floating of particles in the reaction chamber and adhering of the particles to the semiconductor substrate. Such a phenomenon is caused by a rise in a pressure in the reaction chamber resulted from a drastic gas flow into the reaction chamber.

In the first step 31, radio-frequency power of 27.12 MHz is applied within the limits of 200W to 1000W and radio-frequency power of 400 kHz is applied within the limits of 50W to 500W. In this step, formation of a silicon carbide film on a semiconductor substrate is started.

$CO_2$ 44 is brought in. After the stabilization step, the process proceeds to the second step 32. In the second step, a carbon-containing silicon oxide film is formed by adding $CO_2$. By applying the same radio-frequency power set up in the first step, plasma discharge is maintained. Both in the first and the second steps, plasma discharge (33 and 45) is formed by applying radio-frequency power.

After these film formation steps are completed, the process proceeds to the purge step 36. In the purge step, TMS left inside the reaction chamber and other volatile matters generated from decomposition are removed from the reaction chamber by He.

A flow of TMS in the first step is preferably from 200 sccm to 500 sccm, and a flow of He is from 1000 sccm to 3000 sccm. A flow of TMS in the second step is 100 sccm to 500 sccm. A flow of $CO_2$ in the second step is from 1000 sccm to 2500 sccm. A pressure inside the reaction chamber is controlled at a given pressure within the limits of 100 Pa to 1000 Pa, preferably within the limits of 400 Pa to 700 Pa. For radio-frequency power for forming a plasma area, 27.12

MHz at 200W to 1000W and 400 kHz at 50W to 500W are applied. Preferably, 27.12 MHz is set up within the limits of 300W to 600W and 400 kHz is set up within the limits of at 50W to 300W.

In place of He, argon, neon, xenon or krypton can be used, but helium or argon is preferred and a mixed gas of helium and argon can be used as well. Using argon as an inert gas, or argon mixed with helium, high film stress can be realized, and it is effective for increasing the density of a grown film. A flow of helium is the same flow as argon's when argon is used as an inert gas.

A film thickness of a silicon carbide film formed in the first step is 3 to 10 nm, which is determined by a film thickness with which oxygen contained in the carbon-containing silicon oxide film to be formed in the second step does not react to Cu.

A semiconductor substrate is heated during the deposition sequence within the limits of 300° C. to 400° C., preferably from 320° C. to 350° C. As an oxygen source in the second step, $O_2$, $O_3$, $CH_3OH$, $C_2H_5OH$, $CH_3COOH$, $C_2H_5COOH$, $N_2O$, and $N_2O_2$ can be used (however the gas should not be limited thereto) in addition to $CO_2$. Such an oxidizing gas can be used singly or in combination of at least any two of the foregoing.

Figure 3:
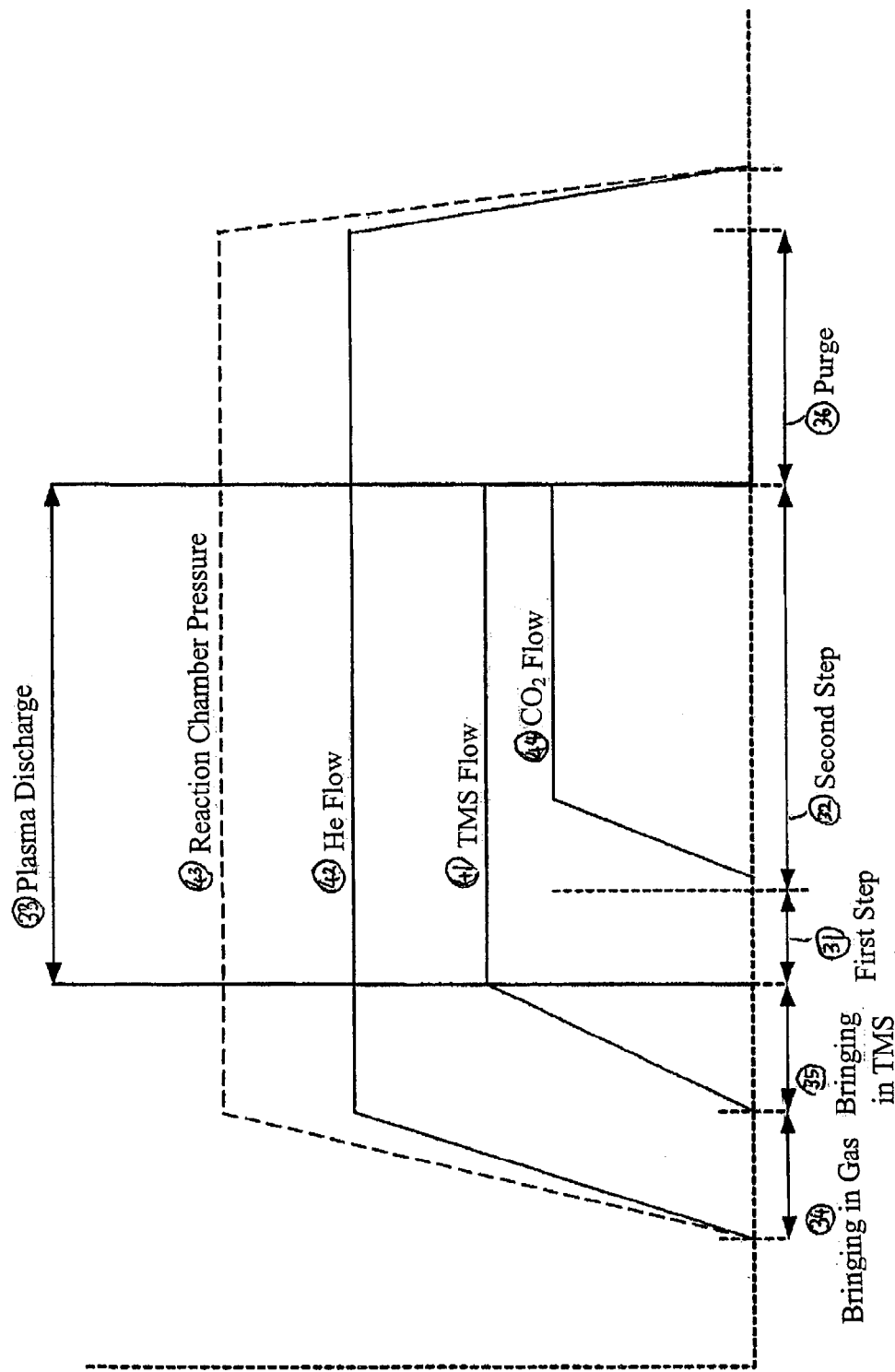
FIG. 3 is a timing chart showing operation sequences for depositing a silicon carbide film and a carbon-containing silicon oxide film on a substrate by plasma reaction according to another embodiment of the present invention.

FIG. 3 is a second working example of the present invention. A flow of respective gases and a pressure inside the reaction chamber 43 in Step 34 'Bringing in a gas' and Step 35 'Bringing in TMS', and in the first step 31 are the same as applied in FIG. 2. The $CO_2$ stabilization step 44, however, is not included. Instead, while plasma discharge is maintained by applying radio-frequency power, $CO_2$ is added in the second step 32, forming a carbon-containing silicon oxide film continuously.

Specific Example

| | | |
|---|---|---|
| 1st step | TMS flow | 100 sccm~1000 sccm |
| | He flow | 1000 sccm~3000 sccm |
| 2nd step | TMS flow | 100 sccm~1000 sccm |
| | $CO_2$ flow | 1000 sccm~2500 sccm |
| | He flow | 1000 sccm~3000 sccm |

Preferred Example

| | | |
|---|---|---|
| 1st step | TMS flow | 200 sccm~500 sccm |
| | He flow | 2000 sccm~3000 sccm |
| 2nd step | TMS flow | 200 sccm~500 sccm |
| | $CO_2$ flow | 1500 sccm~2000 sccm |
| | He flow | 2000 sccm~3000 sccm |

Figure 4:
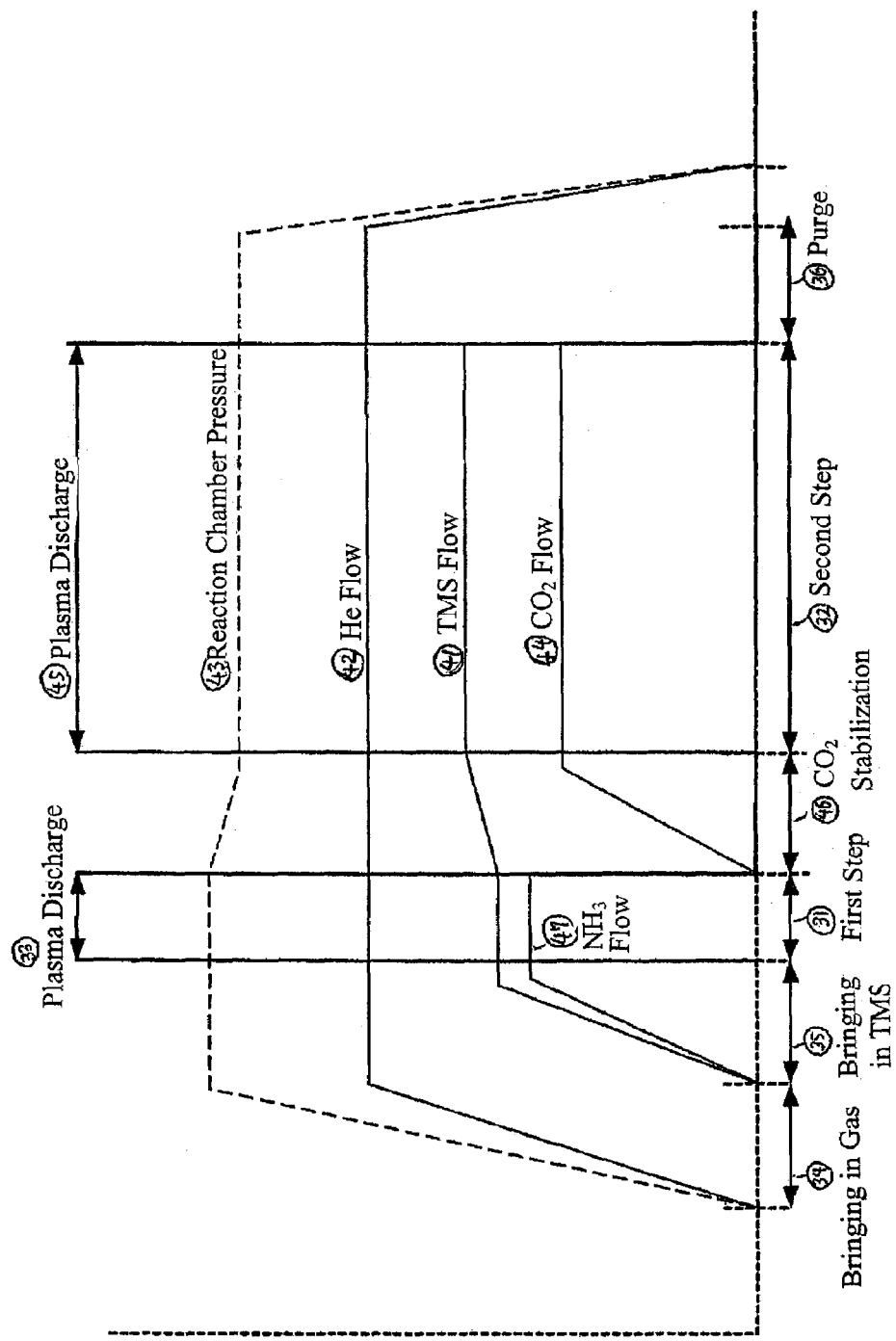
FIG. 4 is a timing chart showing operation sequences for depositing a silicon carbide film and a carbon-containing silicon oxide film on a substrate by plasma reaction according to yet another embodiment of the present invention.

FIG. 4 is a third working example of the present invention. Step 34 'Bringing in a gas' and Step 35 'Bringing in TMS' are the same as in FIG. 2. In the first step, $NH_3$ is brought in, forming a SiCNH film. Then, $CO_2$ is brought in, and after a flow of $CO_2$ is stabilized, a carbon-containing silicon oxide film is formed in the second step 32.

SPECIFIC EXAMPLE

| | | |
|---|---|---|
| 1st step | TMS flow | 100 sccm~1000 sccm |
| | $NH_3$ flow | 100 sccm~500 sccm |
| | He flow | 1000 sccm~3000 sccm |
| 2nd step | TMS flow | 100 sccm~1000 sccm |
| | $CO_2$ flow | 1000 sccm~2500 sccm |
| | He flow | 1000 sccm~3000 sccm |

PREFERRED SPECIFIC EXAMPLE

| | | |
|---|---|---|
| 1st step | TMS flow | 200 sccm~500 sccm |
| | $NH_3$ flow | 100 sccm~300 sccm |
| | He flow | 2000 sccm~3000 sccm |
| 2nd step | TMS flow | 200 sccm~500 sccm |
| | $CO_2$ flow | 1500 sccm~2000 sccm |
| | He flow | 2000 sccm~3000 sccm |

As described above, the present invention can be applied to various damascene methods for forming an interlayer connection structure. For example, a single damascene can be formed as shown in FIGS. 7a to 7h.

Figure 7A:
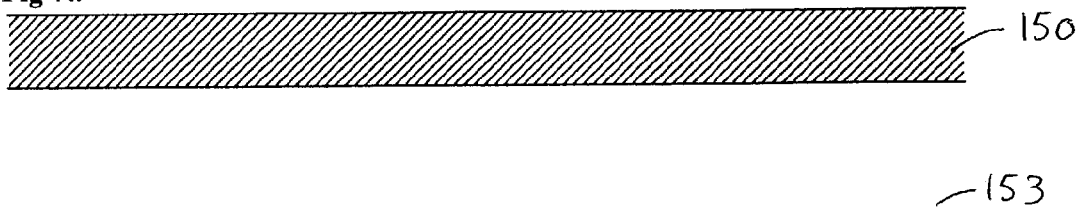
FIGS. 7a to 7h are schematic diagrams showing formation of an interlayer connection structure according to an embodiment of a single damascene method.
Figure 7A:
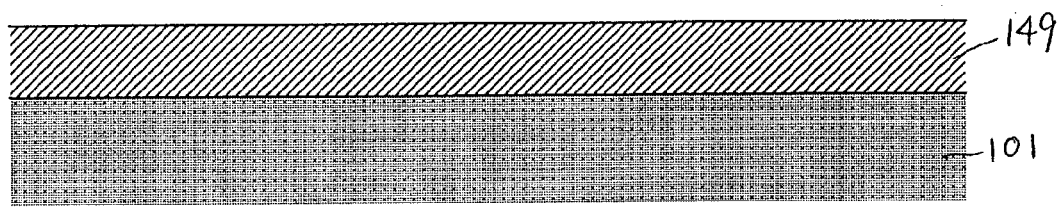
Figure 7B:
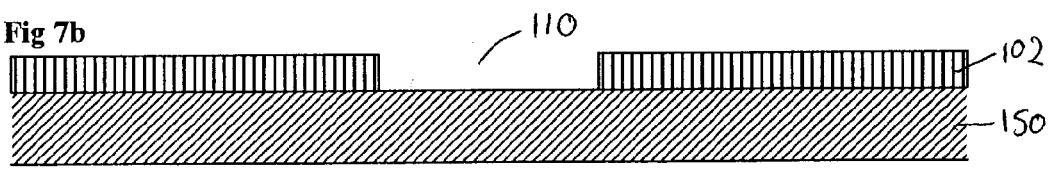
Figure 7B:
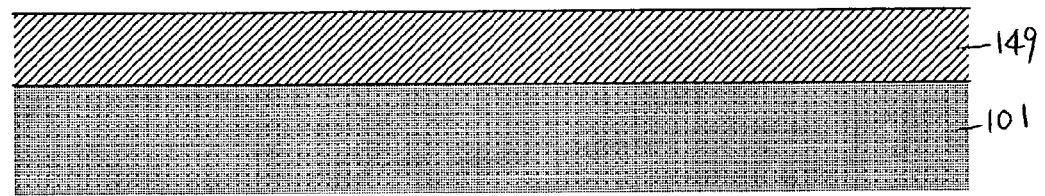
Figure 7C:
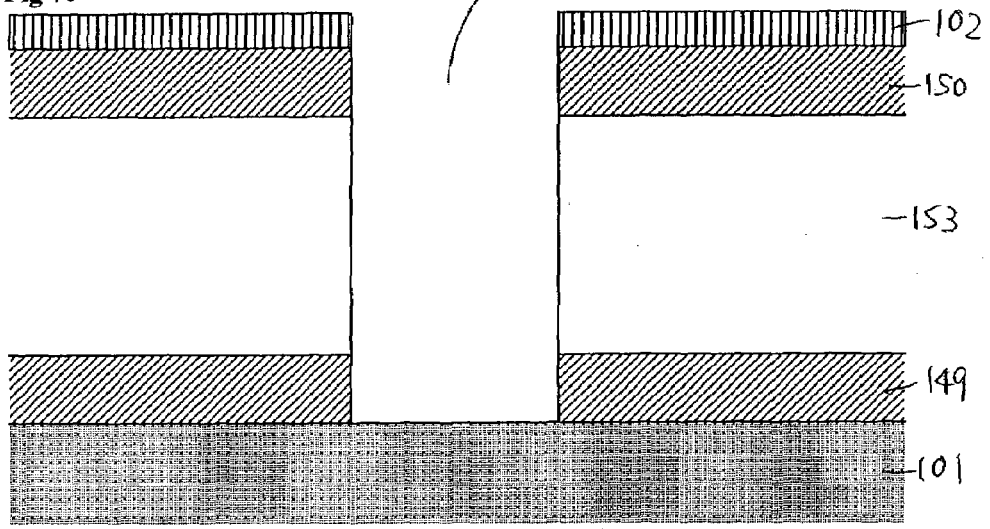
Figure 7D:
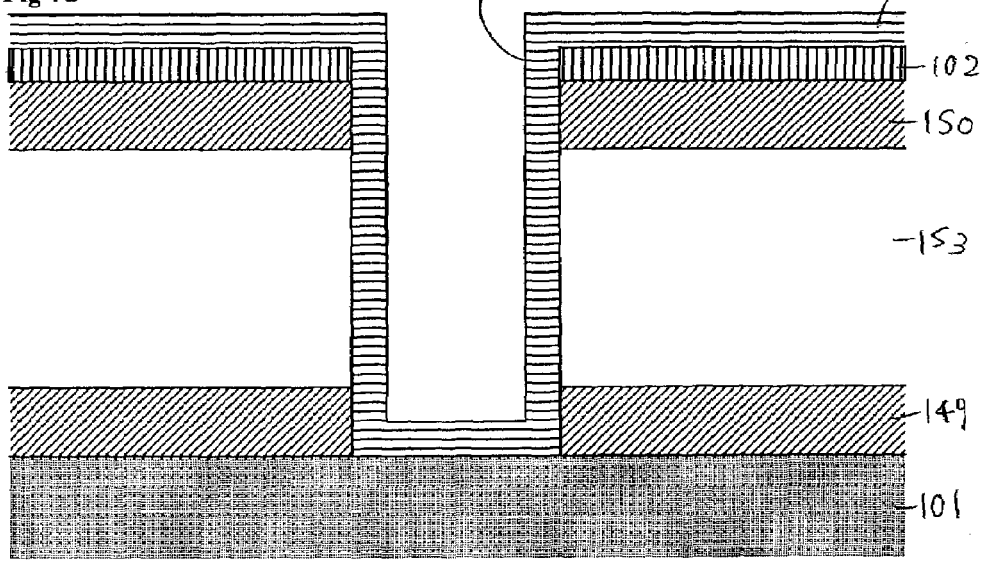
Figure 7E:
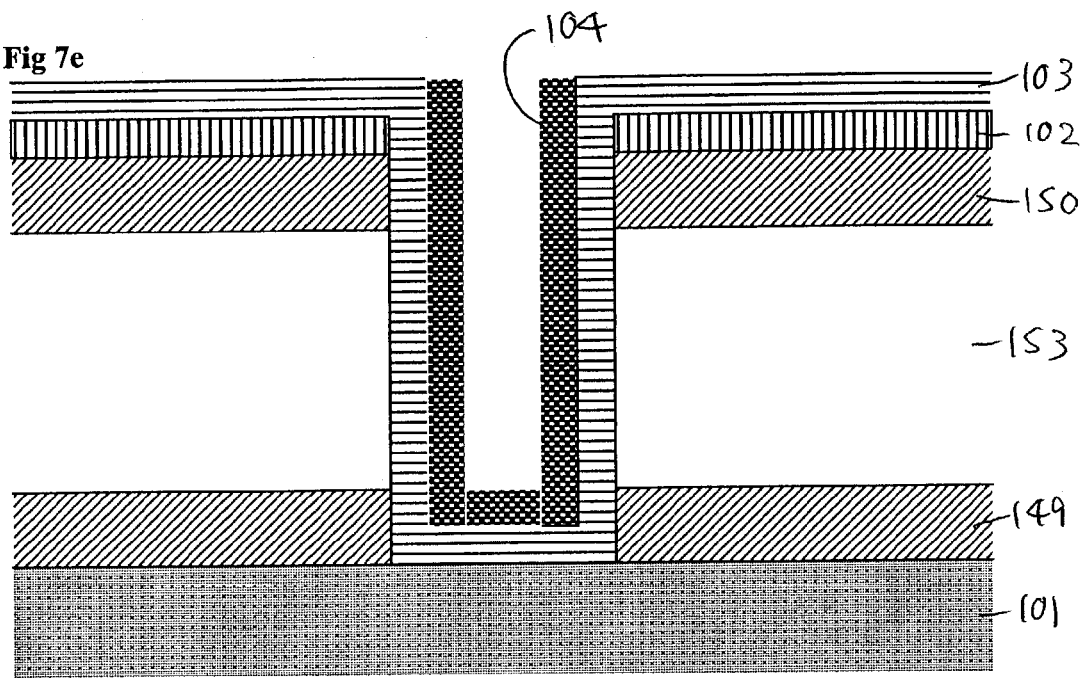
Figure 7:
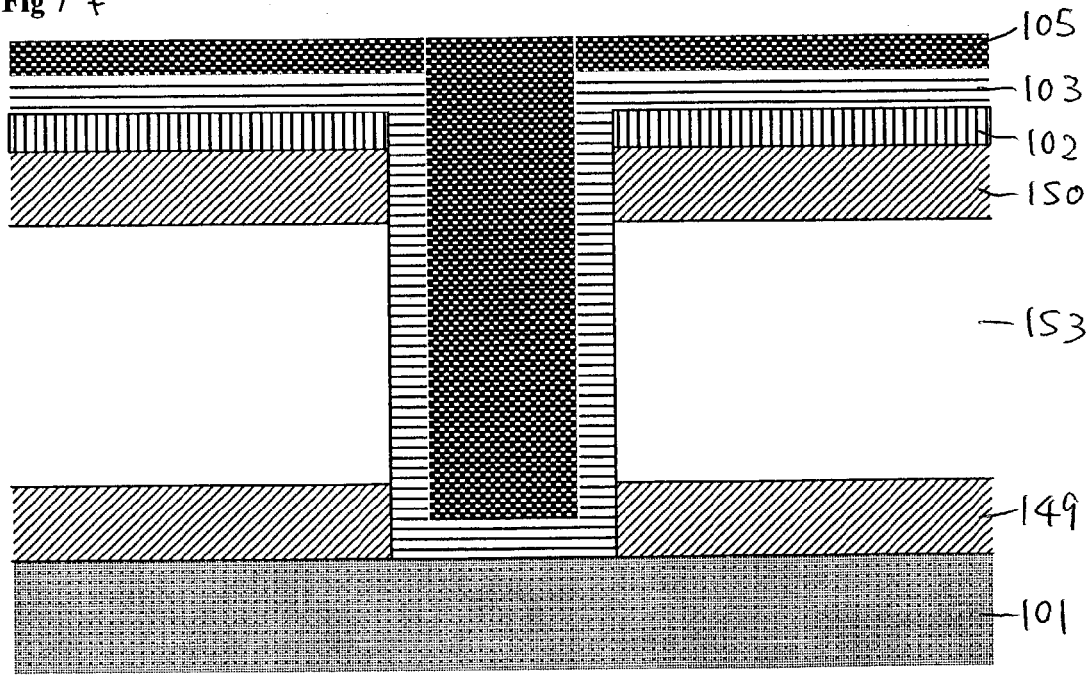
Figure 7G:
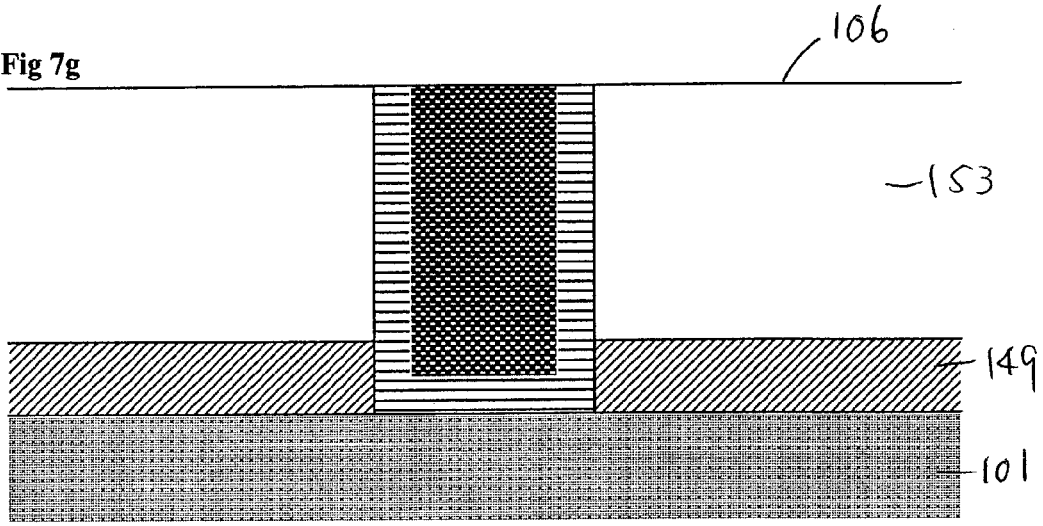

As shown in FIG. 7a, first, on a Si substrate or a low-k layer 101, an etch stop layer 149 is formed, on top of which a low-k layer 153 is deposited. Further, another etch stop layer 150 is deposited. In this embodiment, the other etch stop layer 150 is used as a hard mask for chemical-mechanical polishing (CMP). These etch stop layer can be formed with any suitable material which has a low k and low etch rate. On top of the etch stop layer 150, a photo resist 102 is coated in a pattern (FIG. 7b). The portion 110 is etched to form a via hole 111 (FIG. 7c). The etch stop layer 149 at the bottom can be etched and removed simultaneously or separately from this step. A Cu barrier layer 103 such as TaN or TiN layer is formed inside the via hole, which also covers top of the resist 102 (FIG. 7d). A Cu seed layer 104 is then deposited by CVD or the like (FIG. 7e). Thereafter, Cu 105 is deposited in the hole and a top surface by electric plating or the like (FIG. 7f). By CMP or the like, the Cu 105, the Cu barrier layer 103, the resist 102, and the etch stop layer 150 are removed so that a surface 106 is exposed (FIG. 7g).

Figure 7H:
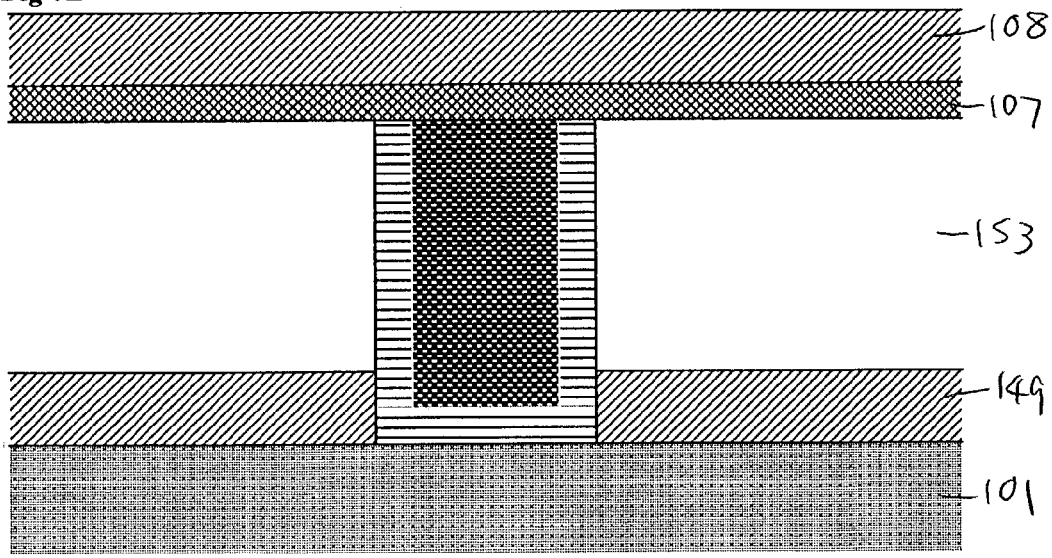

In this embodiment, after the above single damascene formation, when a next etch stop layer is deposited, a silicon carbide layer 107 is first deposited so that Cu diffusion can be prevented (FIG. 7h). A subsequent layer, a carbon-containing silicon oxide layer 108, is deposited on top of the silicon carbide layer 107, but the layer can be free of Cu diffusion due to the presence of the silicon carbide layer, so that oxygen present in the carbon-containing silicon oxide layer 108 can effectively be blocked from Cu. In this embodiment, an etch stop layer consists of the silicon carbide layer 107 and the carbon-containing silicon oxide layer 108, and only the silicon carbide layer 107 is in contact with the Cu.

Figure 8C:
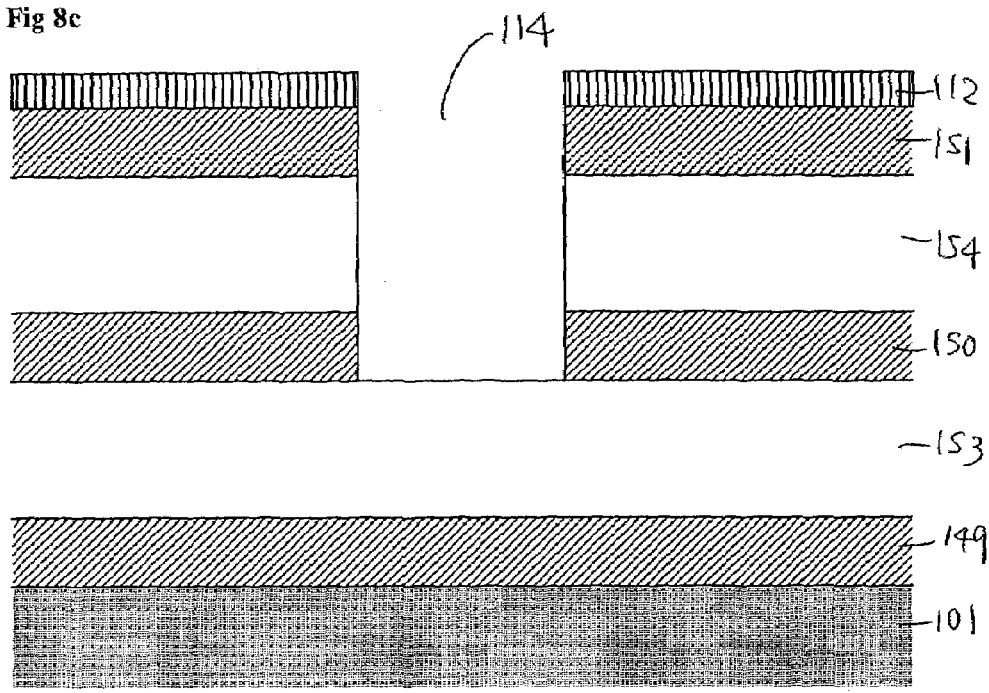
Figure 8D:
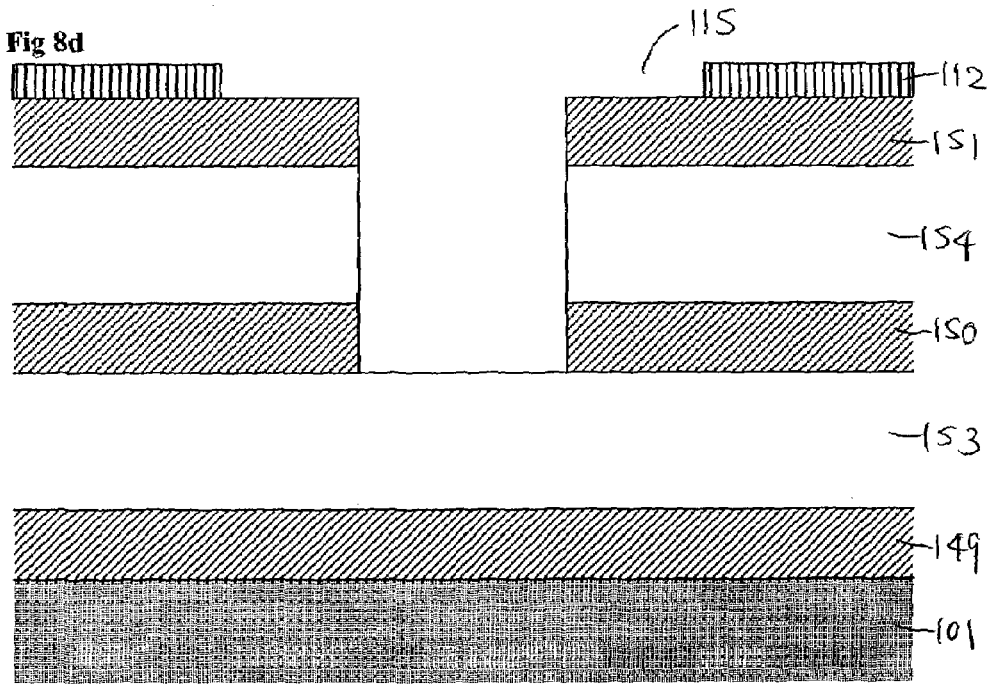
Figure 8E:
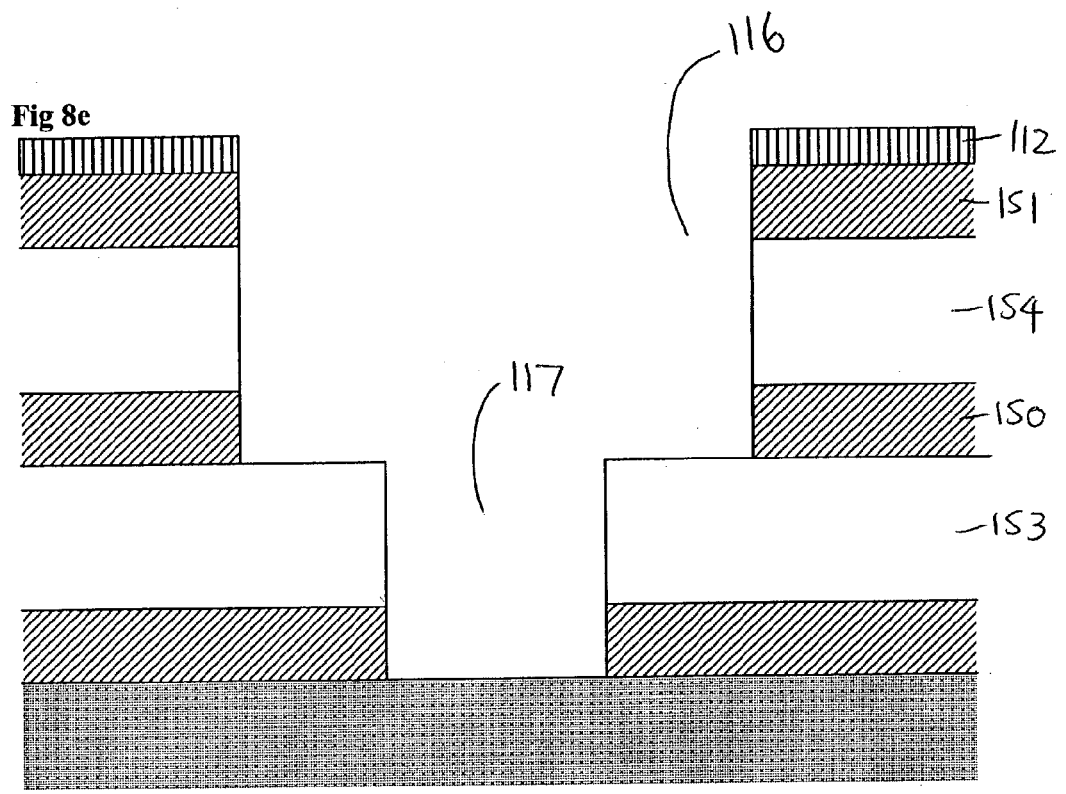
Figure 8F:
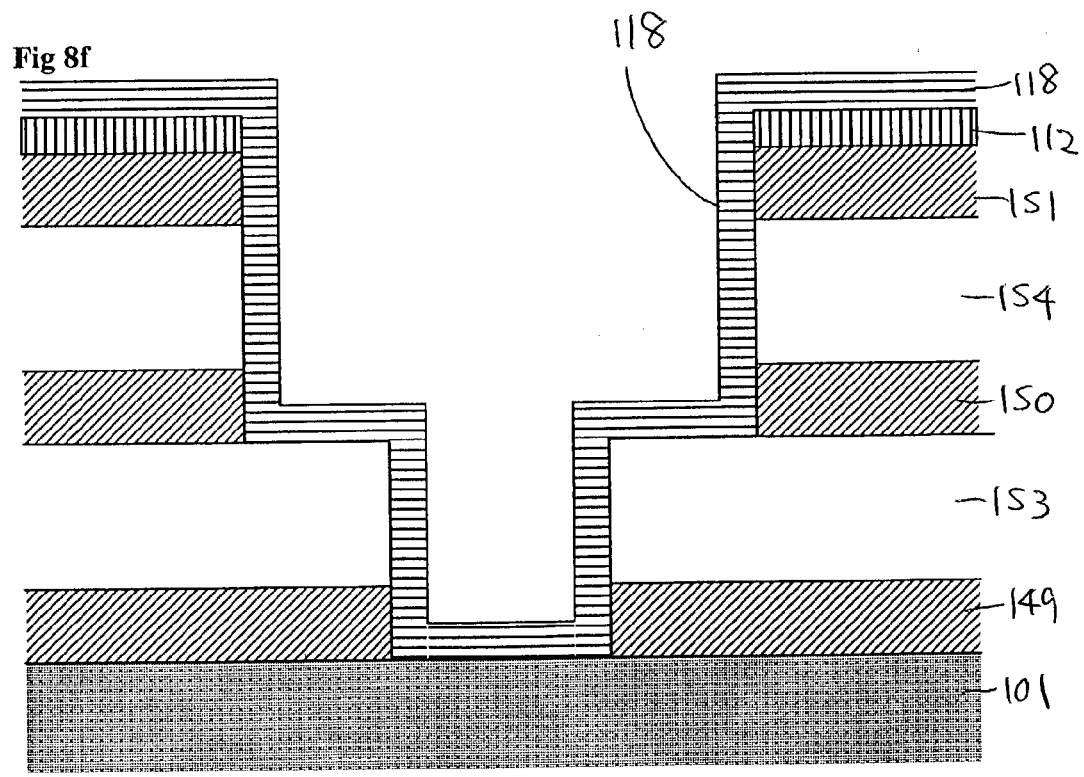
Figure 8G:
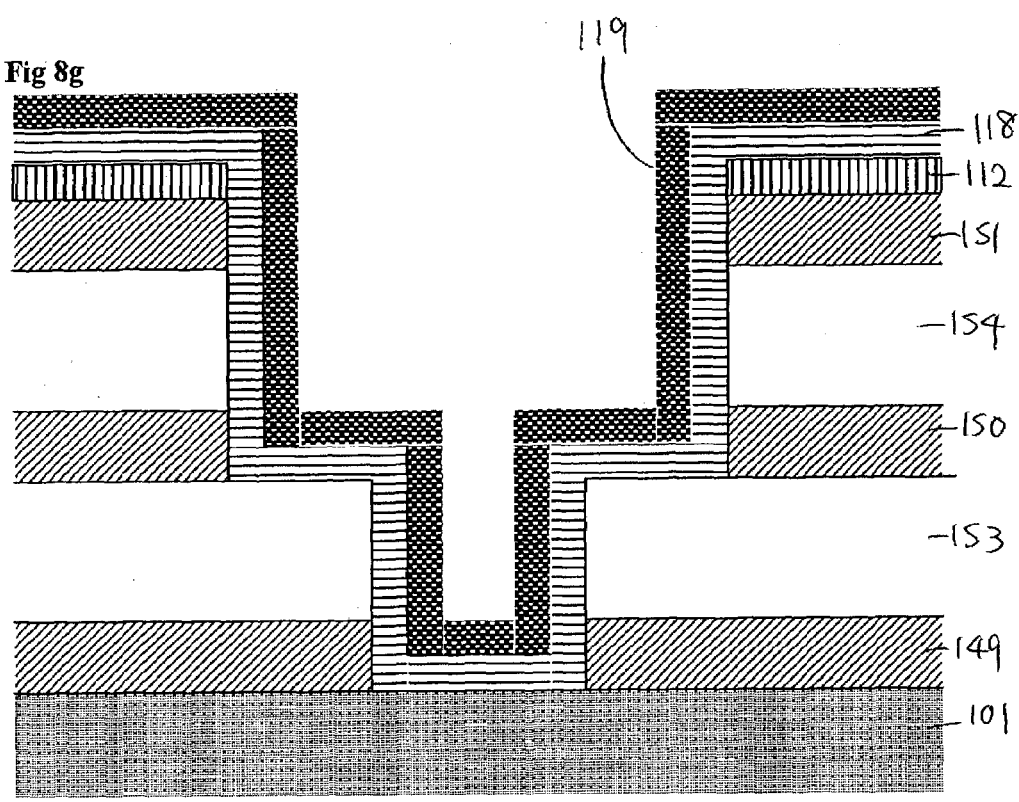
Figure 8H:
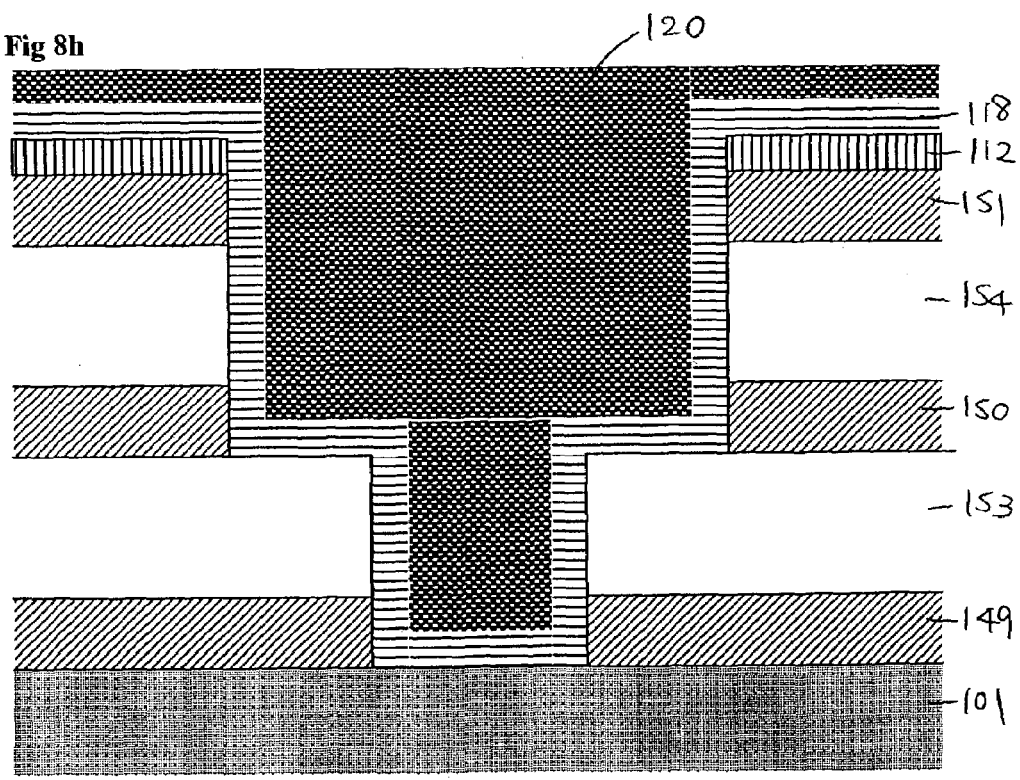
Figure 8I:
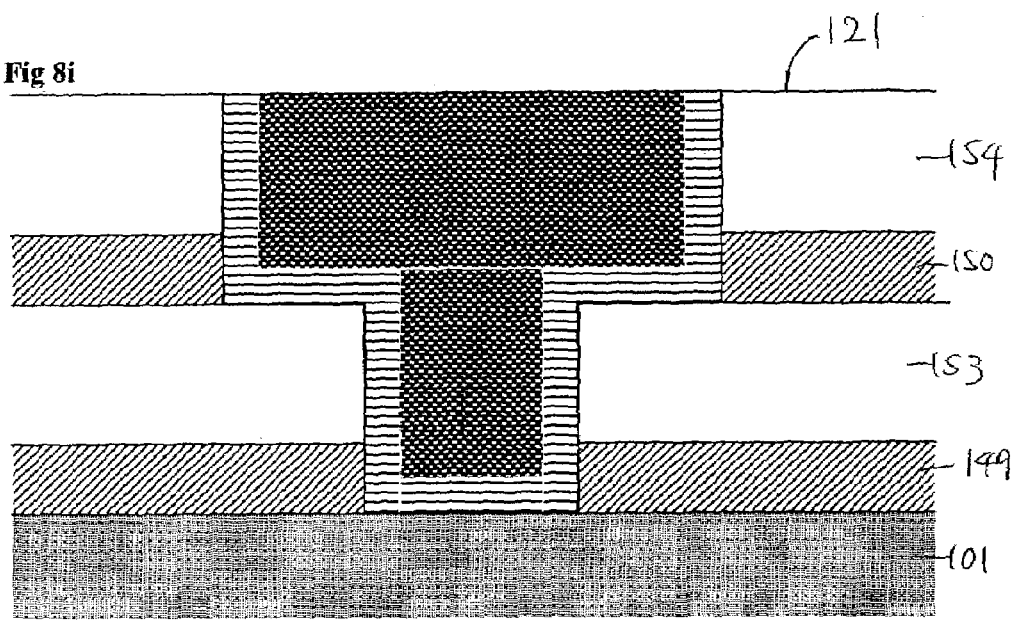

The present invention can also be applied to a dual damascene method. The following is an example:

As shown in FIG. 8a, on a substrate or low-k layer 101, a first etch stop layer 149, a first low-k layer 153, a second etch stop layer 150, a second low-k layer 154, and a third etch stop layer 151 are deposited in sequence. A photo resist 112 is then coated on top of the third etch stop layer 151 in a pattern (FIG. 8b). To form via holes and trenches, any suitable methods can be employed. The following is simply an example:

A via hole 114 is formed using a pattern 113 by etching (FIG. 8c). The second etch stop layer 150 at the bottom of the via hole can be etched and removed simultaneously or separately from this step. The photo resist 112 is further removed in a pattern 115 (FIG. 8d). Etching is conducted to remove a via hole 117 and the first etch stop layer 149, and the third etch stop layer 151, the second low-k layer 154, and the second etch stop layer 150 which are not covered by the resist 112 (FIG. 8e). As a Cu barrier layer, a TaN or TiN layer 118 is then formed (FIG. 8f). Thereafter, a Cu seed layer 119 is deposited by CVD or the like (FIG. 8g). Cu 120 is then deposited in the hole by electric plating or the like (FIG. 8h) By CMP or the like, the Cu 120, the Cu barrier layer 118, the resist 112, and the third etch stop layer 151 are removed so that a surface 121 is exposed (FIG. 8i).

Figure 8J:
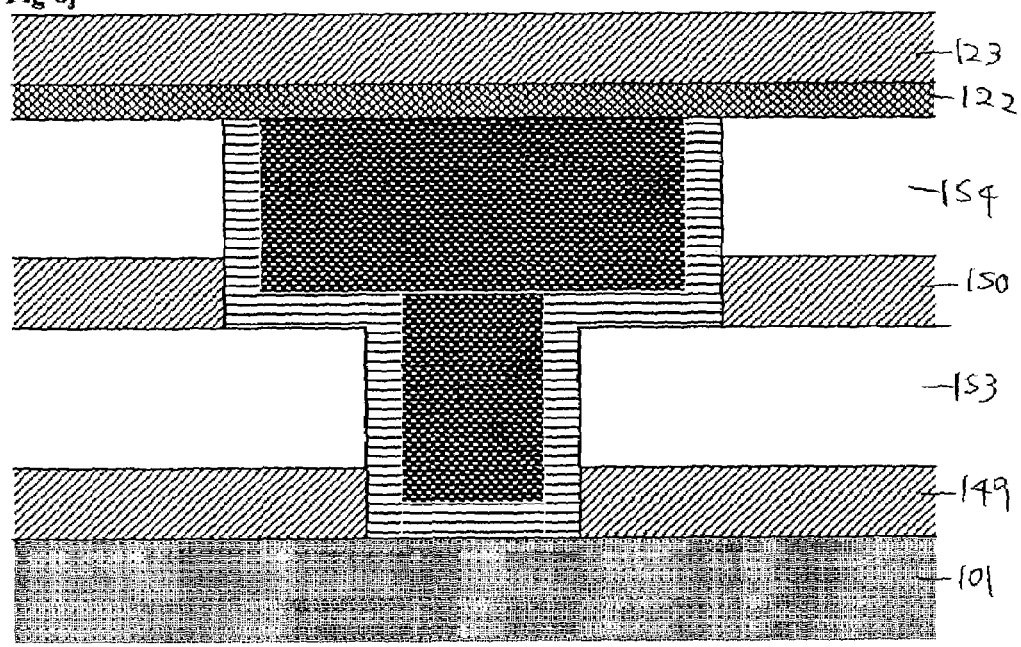

In this embodiment, after the above single damascene formation, when a next etch stop layer is deposited, a silicon carbide layer 122 is first deposited so that Cu diffusion can be prevented (FIG. 8j). A subsequent layer, a carbon-containing silicon oxide layer 123, is deposited on top of the silicon carbide layer 122, but the layer can be free of Cu diffusion due to the presence of the silicon carbide layer, so that oxygen present in the carbon-containing silicon oxide layer 123 can effectively be blocked from Cu. In this embodiment, an etch stop layer consists of the silicon carbide layer 122 and the carbon-containing silicon oxide layer 123, and only the silicon carbide layer 122 is in contact with the Cu.

Figure 6:
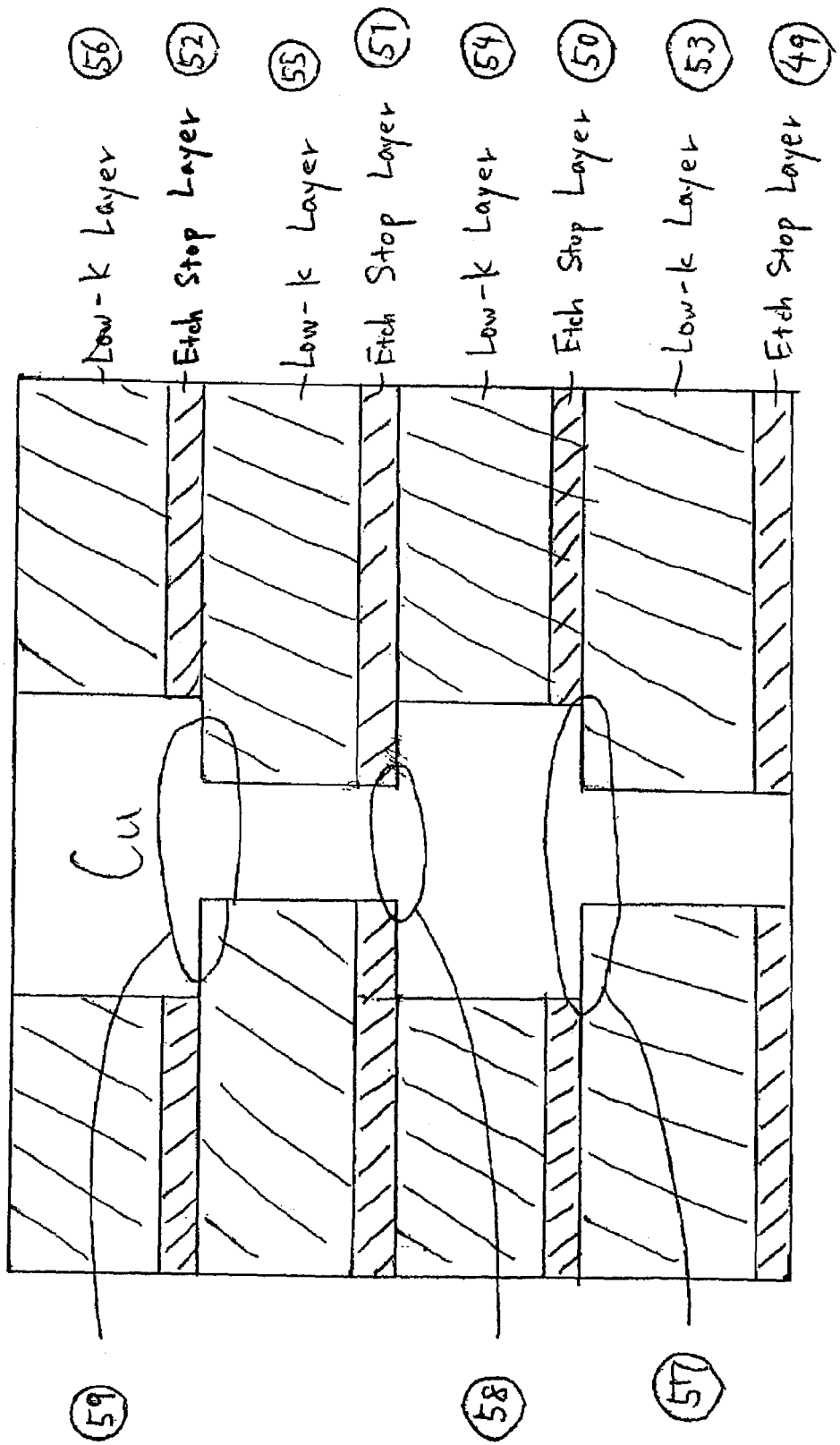
FIG. 6 is a schematic diagram showing an interlayer connection structure according to an embodiment of the present invention.

As a result, as shown in FIG. 6, portions 57, 58, and 59 which may be in contact with Cu during the film formation processes are protected from Cu diffusion. In FIG. 6, low-k layers 53, 54, 55, and 56 are deposited on etch stop layers 49, 50, 51, and 52, respectively. Other layers such as Cu barrier layers are not shown in the figure. Although the silicon carbide layers may be in contact with Cu only during the formation processes and may not be in contact with Cu in the final device, such a temporary contact may inflict adverse effects on the final device. Further, depending on the interlayer structure, the silicon carbide layers may still be in contact with Cu in the final device. In the above cases, the present invention can prevent actual and potential adverse effects by such a contact on the final device.

In the above, the low-k layers and the silicon carbide layers can be deposited in the same reaction chamber or different chambers. When using different chambers, preferably, a module-type CVD apparatus including multiple reaction chambers connected to each other is used. When continuously depositing a silicon carbide layer on top of a low-k layer, the source gas may be changed from dimethyldimetoxysilane (DM-DMOS) to TMS, for example, and the reaction temperature may be decreased by 10° C. to 50° C. (e.g., lowered from 430° C. to 400° C.). Further, for depositing a silicon carbide layer, high-frequency power (e.g., higher than 2 MHz) and low-frequency power (lower than 2 MHz) may preferably be overlaid to excite a plasma, as compared with the use of high-frequency power only in depositing a low-k layer.

EXAMPLES

Using the apparatus shown in FIG. 1, the following examples and comparative examples are conducted:

Comparative Film 1:
The film formation conditions were shown below.

| Deposition Temp. | TMS Flow | He Flow | Reaction Chamber Pressure | 27.12 MHz | 400 kHz |
|---|---|---|---|---|---|
| 380° C. | 300 sccm | 2500 sccm | 533 Pa | 450 W | 100 W |

Figure 5:
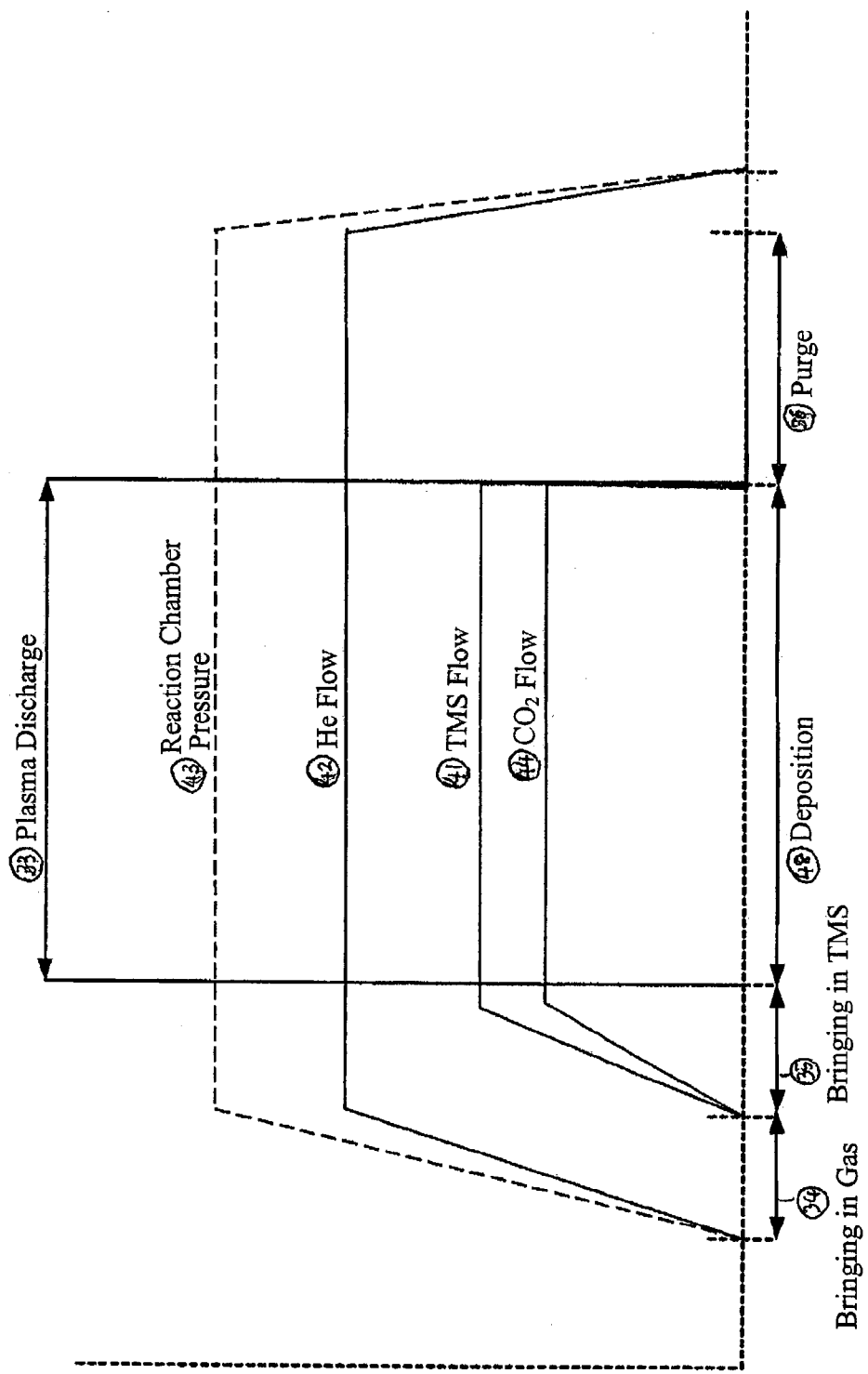
FIG. 5 is a timing chart showing operation sequences for depositing a carbon-containing silicon oxide film on a substrate by plasma reaction according to a comparative embodiment.

No First Step was conducted. The Second Step was conducted according to the sequences shown in FIG. 5.
CO$_2$ Flow 1900 sccm Deposition Film 1:
The First Step and Second Step film formations were conducted as shown below and according to the sequences shown in FIG. 2.

| | | | First Step | | |
|---|---|---|---|---|---|
| Deposition Temp. | TMS Flow | He Flow | Reaction Chamber Pressure | 27.12 MHz | 400 kHz |
| 380° C. | 300 sccm | 2500 sccm | 533 Pa | 450 W | 100 W |

The Second Step (A TMS flow and a He flow are the same values as applied in the First Step.)
CO$_2$ Flow 1900 sccm Deposition Film 2:
The First Step and Second Step film formations were conducted as shown below and according to the sequences shown in FIG. 3.

| | | | First Step | | |
|---|---|---|---|---|---|
| Deposition Temp. | TMS Flow | He Flow | Reaction Chamber Pressure | 27.12 MHz | 400 kHz |
| 380° C. | 300 sccm | 2500 sccm | 533 Pa | 450 W | 100 W |

Second Step (A TMS flow and a He flow are the same values as applied in the First Step.)
CO2 Flow 1900 sccm The characteristics of the resultant deposited films are as shown in the table below.

| | Dielectric Constant | Leakage Current | Stress (Compressive) |
|---|---|---|---|
| Comparative Example | 4.4 | $5.7 \times 10^{-8}$ A/cm$^2$ | 260 MPa |
| Present Invention 1 | 4.4 | $6.1 \times 10^{-8}$ A/cm$^2$ | 260 MPa |
| Present Invention 2 | 4.3 | $5.6 \times 10^{-8}$ A/cm$^2$ | 270 MPa |

Because a silicon carbide film, which does not contain oxygen, is formed as an initial film for the carbon-containing silicon oxide film formed using the method according to the present invention, problems such as film peeling and conduction failure, which are caused by reaction of Cu and oxygen used as cable materials, can be avoided.

Effects of Invention

A dielectric constant of the carbon-containing silicon oxide film according to the present invention was within the limits of 4.0 to 4.5, and a leakage current value was approximately 5~$6 \times 10^{-8}$ A/cm$^2$. For comparison, a silicon carbide film was formed by eliminating the first step, and characteristics of the film formed were measured. A nearly equal film having a dielectric constant of 4.4 and a leak current value of $5.7 \times 10^{-8}$ A/cm$^2$ was obtained.

The source gas for a low dielectric layer is not limited to the above embodiments and may be a compound disclosed in U.S. Pat. Nos. 6,352,945, 6,383,955, and 6,432,846, all of which are incorporated herein by reference in their entirety. The flow rate of each gas can be those disclosed in the above U.S. patents. Further, in the present invention, usable are the apparatus and the conditions disclosed in U.S. patent applications Ser. No. 09/511,934 filed Feb. 24, 2000 and Ser. No. 09/764,523 filed Jan. 18, 2001, U.S. Pat. Nos. 5,788,778, and 5,788,799. The disclosure of each of the above is incorporated herein by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming a film on a semiconductor substrate where a copper layer is to be formed and in contact with the film, comprising the steps of:
   introducing a deposition gas containing silicon, carbon, and hydrogen, and an inert gas, into a reaction space where a substrate is placed;
   depositing a silicon carbide film on the substrate by exciting the deposition gas and the inert gas into a plasma;
   introducing an oxidizing gas at a flow rate greater than that of the deposition gas into the reaction space while continuously introducing the deposition gas and the inert gas into the reaction space; and
   depositing a carbon-containing silicon oxide film on top of the silicon carbide film by exciting the deposition gas, the oxidizing gas, and the inert gas into a plasma.

2. The method according to claim 1, wherein the silicon carbide film contains no oxygen.

3. The method according to claim 1, wherein the silicon carbide film is formed where a copper wiring layer is to be formed and in contact with the silicon carbide film.

4. A method for forming a film on a semiconductor substrate where a copper layer is to be formed and in contact with the film, comprising the steps of:
   introducing a first reaction gas comprising a deposition gas containing silicon, carbon, and hydrogen, and an inert gas, into a reaction space where a substrate is placed;
   depositing a silicon carbide film on the substrate by exciting the first reaction gas into a plasma;
   introducing a second reaction gas comprising a deposition gas containing silicon, carbon, and hydrogen, an oxidizing gas, and an inert gas, into the reaction space; and
   depositing a carbon-containing silicon oxide film on top of the silicon carbide film by exciting the second reaction gas into a plasma,
   wherein the excitation of the first and second reaction gases are conducted by applying radio-frequency (RF) power to the respective gases.

5. The method according to claim 4, wherein the step for depositing the silicon carbide and the step for depositing the carbon-containing silicon oxide film are continuously performed without interruption of RF power supply.

6. The method according to claim 4, wherein RF power supply is discontinued between the step for depositing the silicon carbide and the step for depositing the carbon-containing silicon oxide film.

7. The method according to claim 6, wherein RF power supply is reinitiated after introducing the second reaction gas and stabilizing the pressure.

8. A method for forming a film on a semiconductor substrate where a copper layer is to be formed and in contact with the film, comprising the steps of:
   introducing a first reaction gas comprising a deposition gas containing silicon, carbon, and hydrogen, and an inert gas, into a reaction space where a substrate is placed;
   depositing a silicon carbide film on the substrate by exciting the first reaction gas into a plasma;
   introducing a second reaction gas comprising a deposition gas containing silicon, carbon, and hydrogen, an oxidizing gas, and an inert gas, into the reaction space; and
   depositing a carbon-containing silicon oxide film on top of the silicon carbide film by exciting the second reaction gas into a plasma,
   wherein the deposition gas is tetramethylsilane or trimethylsilane.

9. The method according to claim 1, wherein the inert gas is argon, helium, neon, xenon, or krypton.

10. The method according to claim 1, wherein the silicon carbide film comprises silicon, carbon, nitrogen and hydrogen.

11. The method according to claim 1, where the carbon-containing silicon oxide film comprises silicon, carbon, oxygen and hydrogen.

12. The method according to claim 1, wherein the carbon-containing silicon oxide film is formed at a temperature of the substrate of 300° C. to 400° C.

13. The method according to claim 1, where the silicon carbide film is formed at a temperature of the substrate of 300° C. to 400° C.

14. A method for forming a film on a semiconductor substrate where a copper layer is to be formed and in contact with the film, comprising the steps of:
   introducing a first reaction gas comprising a deposition gas containing silicon, carbon, and hydrogen, and an inert gas, into a reaction space where a substrate is placed;
   depositing a silicon carbide film on the substrate by exciting the first reaction gas into a plasma;
   introducing a second reaction gas comprising a deposition gas containing silicon, carbon, and hydrogen, an oxidizing gas, and an inert gas, into the reaction space; and
   depositing a carbon-containing silicon oxide film on top of the silicon carbide film by exciting the second reaction gas into a plasma,
   wherein the deposition of the silicon carbide film is discontinued when the thickness of the silicon carbide film reaches 3 nm to 10 nm.

15. A method for forming a film on a semiconductor substrate where a copper layer is to be formed and in contact with the film, comprising the steps of:
   introducing a first reaction gas comprising a deposition gas containing silicon, carbon, and hydrogen, and an inert gas, into a reaction space where a substrate is placed;
   depositing a silicon carbide film on the substrate by exciting the first reaction gas into a plasma;
   introducing a second reaction gas comprising a deposition gas containing silicon, carbon, and hydrogen, an oxidizing gas, and an inert gas, into the reaction space; and
   depositing a carbon-containing silicon oxide film on top of the silicon carbide film by exciting the second reaction gas into a plasma, wherein the deposition of the carbon-containing silicon oxide film is discontinued when the thickness of the carbon-containing silicon oxide film reaches 30 nm to 70 nm.

16. A method for forming a film on a semiconductor substrate where a copper layer is to be formed and in contact with the film, comprising the steps of:
introducing a first reaction gas comprising a deposition gas containing silicon, carbon, and hydrogen, and an inert gas, into a reaction space where a substrate is placed;
depositing a silicon carbide film on the substrate by exciting the first reaction gas into a plasma;
introducing a second reaction gas comprising a deposition gas containing silicon, carbon, and hydrogen, an oxidizing gas, and an inert gas, into the reaction space; and
depositing a carbon-containing silicon oxide film on top of the silicon carbide film by exciting the second reaction gas into a plasma,
wherein the step for depositing the silicon carbide film and the step for depositing the carbon-containing silicon oxide film are conducted in a reaction chamber where a low dielectric layer is formed on the substrate.

17. A method for forming a film on a semiconductor substrate where a copper layer is to be formed and in contact with the film, comprising the steps of:
introducing a first reaction gas comprising a deposition gas containing silicon, carbon, and hydrogen, and an inert gas, into a reaction space where a substrate is placed;
depositing a silicon carbide film on the substrate by exciting the first reaction gas into a plasma;
introducing a second reaction gas comprising a deposition gas containing silicon, carbon, and hydrogen, an oxidizing gas, and an inert gas, into the reaction space; and
depositing a carbon-containing silicon oxide film on top of the silicon carbide film by exciting the second reaction gas into a plasma,
wherein the step for depositing the silicon carbide film and the step for depositing the carbon-containing silicon oxide film are conducted in a reaction chamber in the vicinity of a reaction chamber where a low dielectric layer is formed on the substrate.

18. The method according to claim 1, wherein the film is an etch stop layer.

19. The method according to claim 1, wherein the film is a hard mask.

20. A method for manufacturing on a semiconductor substrate an interlayer structure containing a film in contact with a copper layer, comprising the steps of:
(i) forming multiple layers on a semiconductor substrate;
(ii) forming a hole for an interlayer connection of the multiple layers by etching;
(iii) depositing copper in the hole;
(iv) removing an excess of the copper from a top of the multiple layers;
(v) depositing a silicon carbide film on the top of the multiple layers by plasma reaction, wherein the copper is covered by the silicon carbide film; and
(vi) depositing a carbon-containing silicon oxide film on top of the silicon carbide film by plasma reaction.

21. The method according to claim 20, wherein the multiple layers comprise a lower etch stop layer, a low dielectric layer, and an upper etch stop layer laminated in sequence on the substrate, and in step (ii) the hole is produced by forming a resist on top of the upper etch stop layer and forming a via hole by etching the multiple layers using the resist, and in step (iv) the resist and the upper etch stop layer are removed when removing the excess of the copper.

22. The method according to claim 20, wherein the multiple layers comprise a lower etch stop layer, a lower low dielectric layer, an intermediate etch stop layer, an upper low dielectric layer, and in step (ii) an upper etch stop layer laminated in sequence on the substrate, and the hole is produced by forming a resist on top of the upper etch stop layer and forming a via hole and trench by etching the multiple layers using the resist, and in step (iv) the resist and the upper etch stop layer are removed when removing the excess of the copper.

23. The method according to claim 20, wherein prior to step (i), a low dielectric layer is formed on the substrate, and the multiple layers are formed on top of the low dielectric layer.

24. The method according to claim 20, wherein steps (i) through (iv) are repeated at least once.

25. The method according to claim 1, wherein the oxidizing gas is $CO_2$.

26. The method according to claim 1, wherein the oxidizing gas flows at a flow rate of 1000 sccm to 2500 sccm.

27. The method according to claim 1, wherein the deposition gas flows constantly at a flow rate of 100 sccm to 1000 sccm.

28. The method according to claim 1, wherein $NH_3$ is added to the deposition gas and the inert gas when forming the silicon carbide film.

* * * * *

UNITED STATES PATENT AND TRADEMARK OFFICE
CERTIFICATE OF CORRECTION

PATENT NO. : 7,091,133 B2  Page 1 of 1
APPLICATION NO. : 10/352357
DATED : August 15, 2006
INVENTOR(S) : Kamal Kisho Goundar and Tadashi Kumakura It is certified that error appears in the above-identified patent and that said Letters Patent is hereby corrected as shown below:

At column 2, line 65, please delete "tetramethylsiliane" and insert -- tetramethylsilane --, therefor.

At column 6, line 39, please delete "3 mm to 30 mm" and insert --3 nm to 30 nm --, therefor.

At column 6, line 40, please delete "15 mm)," and insert -- 15 nm). --, therefor.

At column 8, line 23, please delete "200 m" and insert -- 200 mm --, therefor.

At column 8, line 31, after "limits of" please delete "1000" and insert -- 100 --, therefor.

At column 12, line 35, please delete "CO2" and insert -- $CO_2$ --, therefor.

At column 12, line 46, please delete "$10^{8n}$" and insert -- $10^{-8}$ --, therefor.

At column 14, line 17, in Claim 8, please delete "tetramethylsiliane" and insert -- tetramethylsilane --, therefor.

Signed and Sealed this

Second Day of January, 2007

JON W. DUDAS
*Director of the United States Patent and Trademark Office*